(12) United States Patent
Nanno et al.

(10) Patent No.: US 10,158,099 B2
(45) Date of Patent: Dec. 18, 2018

(54) ORGANIC LIGHT-EMITTING DEVICE PRODUCTION METHOD, PRODUCTION SYSTEM THEREFOR, AND PRODUCTION DEVICE THEREFOR

(71) Applicants: JOLED INC., Chiyoda-ku (JP); SUMITOMO CHEMICAL COMPANY, LIMITED, Chuo-ku (JP)

(72) Inventors: Hirotaka Nanno, Tokyo (JP); Masaki Nishimura, Tokyo (JP); Masashi Komatsu, Osaka (JP); Sadamu Yoshida, Osaka (JP)

(73) Assignees: JOLED INC., Chiyoda-ku (JP); SUMITOMO CHEMICAL COMPANY, LIMITED, Chuo-ku (JP)

( * ) Notice: Subject to any disclaimer, the term of this patent is extended or adjusted under 35 U.S.C. 154(b) by 0 days.

(21) Appl. No.: 15/501,705

(22) PCT Filed: Jul. 31, 2015

(86) PCT No.: PCT/JP2015/003865
§ 371 (c)(1),
(2) Date: Feb. 3, 2017

(87) PCT Pub. No.: WO2016/021164
PCT Pub. Date: Feb. 11, 2016

(65) Prior Publication Data
US 2017/0229680 A1 Aug. 10, 2017

(30) Foreign Application Priority Data
Aug. 4, 2014 (JP) ................................ 2014-158649

(51) Int. Cl.
*H01L 21/00* (2006.01)
*H01L 51/56* (2006.01)
(Continued)

(52) U.S. Cl.
CPC ............ *H01L 51/56* (2013.01); *B05B 12/004* (2013.01); *B05B 12/08* (2013.01); *B05B 15/50* (2018.02);
(Continued)

(58) Field of Classification Search
CPC .......................... H01G 9/2059; H01L 2227/32
See application file for complete search history.

(56) References Cited

U.S. PATENT DOCUMENTS 8,492,754 B2 * 7/2013 Nishiyama .......... H01L 27/3248
257/40
2004/0008243 A1 1/2004 Sekiya
(Continued)

FOREIGN PATENT DOCUMENTS

JP 2004-55333 A 2/2004
JP 2004-291456 A 10/2004
(Continued)

OTHER PUBLICATIONS

International Search Report dated Oct. 13, 2015 in PCT/JP15/003865 Filed Jul. 31, 2015.

*Primary Examiner* — Julio J Maldonado
*Assistant Examiner* — Andre' C Stevenson
(74) *Attorney, Agent, or Firm* — Oblon, McClelland, Maier & Neustadt, L.L.P.

(57) ABSTRACT

Organic light-emitting device manufacturing method performed by using a manufacturing apparatus placed where light from outside is blocked and a lighting device emitting light constituted of light components with wavelengths of 500 nm or longer is placed. The manufacturing apparatus includes a main body having an ejector ejecting ink containing organic light-emitting material and a light-transmissive tube forming at least part of a transport path connecting a tank containing the ink and the ejector. The method (Continued)

includes: removing the ink inside the transport path when a total exposure amount ET (lux×hours) satisfies ET≥α× 17500 where α is a constant satisfying α≥1. ET is a product of E denoting light amount (lux) from the lighting device to which the tube is exposed and T denoting time amount (hours) over which the tube is exposed to the light from the lighting device.

23 Claims, 13 Drawing Sheets

(51) Int. Cl.
| | | |
|---|---|---|
| *H01L 51/00* | (2006.01) | |
| *H01L 27/32* | (2006.01) | |
| *B05B 12/08* | (2006.01) | |
| *B05B 12/00* | (2018.01) | |
| *B05B 15/50* | (2018.01) | |
| *H01L 51/50* | (2006.01) | |

(52) U.S. Cl.
CPC ...... *H01L 27/3206* (2013.01); *H01L 51/0005* (2013.01); *H01L 51/5012* (2013.01)

(56) References Cited

U.S. PATENT DOCUMENTS

| | | |
|---|---|---|
| 2005/0140709 A1 | 6/2005 | Sekiya |
| 2005/0147743 A1 | 7/2005 | Sekiya |
| 2011/0204344 A1 | 8/2011 | Kakimoto et al. |
| 2012/0135660 A1 | 5/2012 | Sekiya |
| 2013/0048962 A1 | 2/2013 | Kakimoto et al. |

FOREIGN PATENT DOCUMENTS

| | | |
|---|---|---|
| JP | 2005-914 A | 1/2005 |
| JP | 2008-246456 A | 10/2006 |
| JP | 2007-165605 A | 6/2007 |
| JP | 2011-165658 A | 8/2011 |
| JP | 2011-181498 A | 9/2011 |
| WO | 2016/021520 A1 | 2/2016 |

* cited by examiner

FIG. 4

| | Luminous efficacy cd/A | LT75 hours | Exposure light amount E lux | Exposure time amount T hours | Total exposure amount ET lux × hours |
|---|---|---|---|---|---|
| Implementation sample 1 | 37.9 | 24.1 | 10 | 300 | 3000 |
| Implementation sample 2 | 36.8 | 23.5 | 50 | 250 | 12500 |
| Implementation sample 3 | 36.5 | 23.3 | 100 | 150 | 15000 |
| Comparative sample 1 | 28.4 | 7.4 | 250 | 150 | 37500 |
| Comparative sample 2 | 20.4 | 2.2 | 700 | 150 | 105000 |
| Notes | for 10mA/cm² | Initial luminance = 8000cd/m² | Yellow fluorescent lamp with wavelengths 500 nm and shorter cut | | |

ORGANIC LIGHT-EMITTING DEVICE PRODUCTION METHOD, PRODUCTION SYSTEM THEREFOR, AND PRODUCTION DEVICE THEREFOR

TECHNICAL FIELD

The present invention relates to an organic light-emitting device manufacturing method, an organic light-emitting device manufacturing system, and an organic light-emitting device manufacturing apparatus. In particular, the present invention relates to the management of material quality during manufacturing of organic light-emitting devices.

BACKGROUND ART

Recently, much development is being conducted of organic light-emitting devices having light-emitting layers containing organic light-emitting materials, examples of which include organic electroluminescence (EL) panels and organic EL lighting devices.

When forming a light-emitting layer through a wet process, an ink (solution) containing an organic light-emitting material and a solvent is used. In connection with this, it is known that ink undergoes degradation when exposed to light. In view of this, Patent Literature 1 discloses a method of forming organic layers including a light-emitting layer by performing a wet process in an environment where light components with wavelengths shorter than the maximum absorption wavelength of the light-emitting material is blocked (e.g., light components with wavelengths of 500 nm or shorter are blocked).

CITATION LIST

Patent Literature

[Patent Literature 1]
Japanese Patent Application Publication No.: 2004-55333

SUMMARY OF INVENTION

Technical Problem

However, even if an ink is used in an environment where light components with wavelengths shorter than the maximum absorption wavelength of the light-emitting material are blocked as disclosed in Patent Literature 1, degradation of the ink cannot be avoided completely. In particular, compared to when the ink is still stored in sealed state inside a container, ink degradation occurring is greater when the ink container has been set to the manufacturing apparatus and the ink has been loaded to the manufacturing apparatus. This is because typically, a tube transporting the ink from an ink tank to the manufacturing apparatus is made of a light-transmissive resin material, and thus, the ink undergoes degradation due to being exposed to light while inside the tube.

Manufacturing organic light-emitting devices by using ink having undergone such degradation results in organic light-emitting devices having defects being manufactured. Thus, appropriate management of ink quality is a significant factor of an organic light-emitting device manufacturing method.

One possible measure to prevent the above-described problem would be to use a tube made from a light-blocking material. However, it is actually difficult to select, from among light-blocking materials currently available on the market, a light-blocking material having the characteristics required by a tube for transporting an ink, such as flexibility, solvent resistance, and low impurity content.

In view of the problems described above, the present invention aims to achieve appropriate ink quality management in an organic light-emitting device manufacturing method in which manufacturing of organic light-emitting devices is performed under an environment where light components with wavelengths shorter than the maximum absorption wavelength of the light-emitting material are blocked and in which a tube made of light-transmissive material is used as a tube for transporting an ink, and an organic light-emitting device manufacturing system and an organic light-emitting device manufacturing apparatus using the organic light-emitting device manufacturing method.

Means for Solving Problem

One aspect of the present invention is an organic light-emitting device manufacturing method performed by using a manufacturing apparatus, wherein the manufacturing apparatus is placed in an environment where light from outside is blocked and a lighting device emitting light constituted of light components with wavelengths of 500 nm or longer is placed, and the manufacturing apparatus includes a main body having an ink ejector ejecting an ink containing an organic light-emitting material and a light-transmissive tube forming at least a part of an ink transport path connecting a tank containing the ink and the ink ejector, the manufacturing method including: removing the ink inside the ink transport path when a total exposure amount ET (lux×hours) satisfies $ET \geq \alpha \times 17500$ where $\alpha$ is a constant satisfying $\alpha \geq 1$, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

Advantageous Effects

In the organic light-emitting device manufacturing method pertaining to one aspect of the present invention, management of ink degradation occurring due to exposure of the ink to light is performed by according to the total exposure amount ET. Specifically, when the total exposure amount ET becomes equal to or greater than $\alpha \times 17500$ (where $\alpha \geq 1$) (maximum total exposure amount permissible in terms of ink degradation), the ink inside the ink transport path is removed. Accordingly, the organic light-emitting device manufacturing method pertaining to one aspect of the present invention ensures that ink having undergone degradation exceeding a permissible range is not used in the manufacturing of organic light-emitting devices, and thus ensures that organic light-emitting devices that are manufactured have excellent quality.

BRIEF DESCRIPTION OF DRAWINGS

FIG. 4 shows results of a luminous efficacy test and a lifespan test conducted by changing exposure light amount and exposure time amount.

EMBODIMENTS

<<Overview of Aspects of Present Invention>>

Figure 1A:
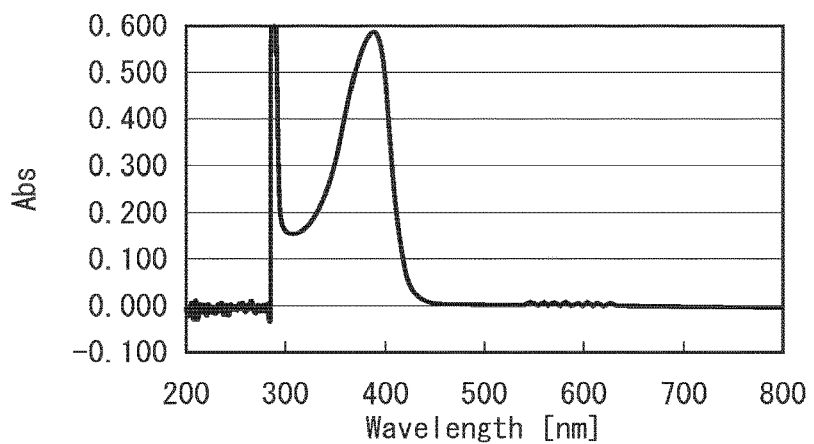
FIG. 1A illustrates one example of a light absorption spectrum of an ink for light-emitting color R.

One aspect of the present invention is an organic light-emitting device manufacturing method performed by using a manufacturing apparatus, wherein the manufacturing apparatus is placed in an environment where light from outside is blocked and a lighting device emitting light constituted of light components with wavelengths of 500 nm or longer is placed, and the manufacturing apparatus includes a main body having an ink ejector ejecting an ink containing an organic light-emitting material and a light-transmissive tube forming at least a part of an ink transport path connecting a tank containing the ink and the ink ejector, the manufacturing method including: removing the ink inside the ink transport path when a total exposure amount ET (lux×hours) satisfies ET≥α×17500 where α is a constant satisfying α≥1, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

In the organic light-emitting device manufacturing method pertaining to one aspect of the present invention, management of ink degradation occurring due to exposure of ink to light is performed according to the total exposure amount ET. Specifically, when the total exposure amount ET becomes equal to or greater than α×17500 (maximum total exposure amount permissible in terms of ink degradation), the ink inside the ink transport path is removed. Accordingly, the organic light-emitting device manufacturing method pertaining to one aspect of the present invention ensures that ink having undergone degradation exceeding a permissible range is not used in the manufacturing of organic light-emitting devices, and thus ensures that organic light-emitting devices that are manufactured have excellent quality.

In the organic light-emitting device manufacturing method pertaining to one aspect of the present invention, α may satisfy α=1.

In the organic light-emitting device manufacturing method pertaining to one aspect of the present invention, α satisfies α≥1. Thus, depending upon α, the maximum total exposure amount may take different values. However, by defining that a satisfies α=1, the strictest maximum total exposure amount is set (i.e., the permissible range of ink degradation becomes smallest), and according to this, the ink inside the ink transport path is removed when the total exposure amount ET becomes equal to or greater than 17500 (the strictest maximum total exposure amount). Accordingly, defining α as described above most certainly ensures that ink having undergone degradation exceeding the permissible range is not used in the manufacturing of organic light-emitting devices, and thus ensures that organic light-emitting devices that are manufactured have excellent quality.

In the organic light-emitting device manufacturing method pertaining to one aspect of the present invention, α may satisfy α=Cw/Ct, where Cw denotes a total volume of the ink transport path, and Ct denotes a volume of the light-transmissive tube.

Exposure of the light-transmissive tube to light from the lighting device while the ink is inside the ink transport path but is not inside the light-transmissive tube does not bring about ink degradation, since the ink is not exposed to the light. Considering such exposure to light in the calculation of the total exposure amount may result in ink being removed and wastefully discarded due to a determination being made that ink degradation has exceeded the permissible range even though ink degradation actually has not exceeded the permissible range. In view of this, defining α as described above results in the management of ink degradation being performed by using a more practical total exposure amount ET calculated by totaling only exposure of the light-transmissive tube to light while the ink is inside the light-transmissive tube. Accordingly, defining α as described above suppresses, for example, the risk of ink whose degradation is still within the permissible range being removed and wastefully discarded and the risk of ink replacement where old ink is removed and replaced with new ink being performed at an unnecessarily high frequency. Thus, defining a as described above contributes to a reduction in cost and an increase in productivity.

In the organic light-emitting device manufacturing method pertaining to one aspect of the present invention, the main body of the manufacturing apparatus may be switchable between a manufacturing mode and a maintenance mode, the main body manufacturing organic light-emitting devices in the manufacturing mode and being under maintenance in the maintenance mode.

In the organic light-emitting device manufacturing method pertaining to one aspect of the present invention, a light-blocking member may be placed between the lighting device and the light-transmissive tube while the main body of the manufacturing apparatus is in the maintenance mode.

According to the above, even when the lighting device is turned on to carry out maintenance, the light from the lighting device is blocked by the light-blocking member. Thus, the amount of light to which the light-transmissive tube is exposed while the maintenance is being carried out can be reduced, and thus ink degradation can be suppressed.

In the organic light-emitting device manufacturing method pertaining to one aspect of the present invention, the light-blocking member may not be placed between the lighting device and the light-transmissive tube while the main body of the manufacturing apparatus is in the manufacturing mode.

According to the above, even when the manufacturing of organic light-emitting devices brings about movement of the light-transmissive tube, the risk is low, for example, of the light-transmissive tube colliding with the light-blocking member.

In the organic light-emitting device manufacturing method pertaining to one aspect of the present invention, the lighting device may be capable of selectively emitting first light and second light, the first light constituted of light components with wavelengths of 500 nm or longer, the second light constituted of light components with wavelengths of 650 nm or longer, and the lighting device may emit the second light while the main body of the manufacturing apparatus is in the manufacturing mode, and emit the first light while the main body of the manufacturing apparatus is in the maintenance mode.

According to this, the lighting device emits the second light, which is constituted of light components with wavelengths that are not likely to bring about ink degradation, while maintenance is being carried out. Thus, the risk of ink degradation occurring during maintenance is suppressed.

In the organic light-emitting device manufacturing method pertaining to one aspect of the present invention, the lighting device may be capable of emitting light selectively switching between multiple brightness levels at least including a first brightness level and a second brightness level brighter than the first brightness level, and the lighting device may emit light with the second brightness level when the total exposure amount ET satisfies ET<D, where D denotes a predetermined value smaller than $\alpha \times 17500$, and emit light with the first brightness level when the total exposure amount ET satisfies $D \leq ET < \alpha \times 17500$.

Accordingly, when there is still some difference between the total exposure amount ET and the maximum total exposure amount, the lighting device is caused to emit light with the highest brightness level, prioritizing user convenience. Meanwhile, when the total exposure amount ET becomes closer to the maximum total exposure amount, the lighting device is caused to emit light with a lower brightness level, whereby the rate of ink degradation is decreased.

Another aspect of the present invention is an organic light-emitting device manufacturing system placed in an environment where light from outside is blocked, the organic light-emitting device manufacturing system including: a lighting device emitting light constituted of light components with wavelengths of 500 nm or longer; a manufacturing apparatus main body having an ink ejector ejecting an ink containing an organic light-emitting material; an ink supplier comprising a light-transmissive tube forming at least a part of an ink transport path connecting a tank containing the ink and the ink ejector; and an exposure light amount sensor detecting an amount of light from the lighting device to which the light-transmissive tube is exposed; a display displaying information for a user; and a controller causing the display to display information urging removal of the ink inside the ink transport path when a total exposure amount ET (lux×hours) satisfies $ET \geq \alpha \times 17500$ where a is a constant satisfying $\alpha \geq 1$, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

In the organic light-emitting device manufacturing system pertaining to another aspect of the present invention, information urging removal of the ink inside the ink transport path is displayed when the total exposure amount ET becomes equal to or greater than $\alpha \times 17500$ (maximum total exposure amount permissible in terms of ink degradation). Then, the user seeing the information displayed on the display would remove the ink inside the ink transport path. Accordingly, the organic light-emitting device manufacturing system pertaining to another aspect of the present invention ensures that ink having undergone degradation exceeding a permissible range is not used in the manufacturing of organic light-emitting devices, and thus ensures that organic light-emitting devices that are manufactured have excellent quality.

In the organic light-emitting device manufacturing system pertaining to another aspect of the present invention, a may satisfy $\alpha = 1$.

This means that the ink inside the ink transport path is removed when the total exposure amount ET becomes equal to or greater than 17500, which is this strictest maximum total exposure amount. Accordingly, the organic light-emitting device manufacturing system pertaining to another aspect of the present invention most certainly ensures that ink having undergone degradation exceeding the permissible range is not used in the manufacturing of organic light-emitting devices, and thus ensures that organic light-emitting devices that are manufactured have excellent quality.

In the organic light-emitting device manufacturing system pertaining to another aspect of the present invention, $\alpha$ may satisfy $\alpha = Cw/Ct$, where Cw denotes a total volume of the ink transport path, and Ct denotes a volume of the light-transmissive tube.

Defining $\alpha$ as described above results in the management of ink degradation being performed by using a more practical total exposure amount ET that is calculated by totaling only exposure of the light-transmissive tube to light while the ink is inside the light-transmissive tube. Accordingly, defining $\alpha$ as described above suppresses, for example, the risk of ink whose degradation is still within the permissible range being removed and wastefully discarded and the risk of ink replacement where old ink is removed and replaced with new ink being performed at an unnecessarily high frequency. Thus, defining $\alpha$ as described above contributes to a reduction in cost and an increase in productivity.

In the organic light-emitting device manufacturing system pertaining to another aspect of the present invention, the manufacturing apparatus main body may be switchable between a manufacturing mode and a maintenance mode, the manufacturing apparatus main body manufacturing organic light-emitting devices in the manufacturing mode and being under maintenance in the maintenance mode.

The organic light-emitting device manufacturing system pertaining to another aspect of the present invention may further include a light-blocking member placed between the lighting device and the light-transmissive tube while the manufacturing apparatus main body is in the maintenance mode.

According to the above, even when the lighting device is turned on to carry out maintenance, the amount of light to which the light-transmissive tube is exposed while the maintenance is being carried out can be reduced by the light-blocking member, and thus ink degradation during maintenance can be suppressed.

The organic light-emitting device manufacturing system pertaining to another aspect of the present invention may further include a light-blocking member holder holding the light-blocking member to be movable between a light-blocking position and an open position, the light-blocking member located between the light-transmissive tube and the lighting device at the light-blocking position and not located between the light-transmissive tube and the lighting device at the open position, wherein the controller may cause the light-blocking member holder to hold the light-blocking member at the light-blocking position while the manufacturing apparatus main body is in the maintenance mode, and cause the light-blocking member holder to hold the light-blocking member at the open position while the manufacturing apparatus main body is in the manufacturing mode.

According to this, the light-blocking member is held at the light-blocking position while the manufacturing apparatus main body is in the maintenance mode. Thus, exposure of the light-transmissive tube to the light from the lighting device is prevented and ink degradation is suppressed during maintenance. Meanwhile, even if the light-transmissive tube moves while the manufacturing apparatus main body is in the manufacturing mode, the light blocking member does not interfere with the movement of the light-transmissive tube for being held at the open position.

In the organic light-emitting device manufacturing system pertaining to another aspect of the present invention, the lighting device may include a first light source emitting first light and a second light source emitting second light, is capable of selectively lighting the first light source and the second light source, the first light constituted of light components with wavelengths of 500 nm or longer, the second light constituted of light components with wavelengths of 650 nm or longer, and the controller may cause the lighting device to light the second light source while the manufacturing apparatus main body is in the manufacturing mode, and cause the lighting device to light the first light source while the manufacturing apparatus main body is in the maintenance mode.

According to this, the lighting device emits the second light, which is constituted of light components with wavelengths that are not likely to bring about ink degradation, while maintenance is being carried out. Thus, the risk of ink degradation occurring due to the ink being exposed to light during maintenance is suppressed.

In the organic light-emitting device manufacturing system pertaining to another aspect of the present invention, the lighting device may be capable of emitting light selectively switching between multiple brightness levels at least including a first brightness level and a second brightness level brighter than the first brightness level, and the controller may cause the lighting device to emit light with the second brightness level when the total exposure amount E×T satisfies ET<D, where D denotes a predetermined value smaller than $\alpha \times 17500$, and cause the lighting device to emit light with the first brightness level when the total exposure amount E×T satisfies D≤ET<$\alpha \times 17500$.

Accordingly, when there is still some difference between the total exposure amount ET and the maximum total exposure amount, the lighting device is caused to emit light with the highest brightness level, prioritizing user convenience. Meanwhile, when the total exposure amount ET becomes closer to the maximum total exposure amount, the lighting device is caused to emit light with a lower brightness level, whereby the rate of ink degradation is decreased.

Another aspect of the present invention is an organic light-emitting device manufacturing apparatus placed in an environment where light from outside is blocked and a lighting device emitting light constituted of light components with wavelengths of 500 nm or longer is placed, the organic light-emitting device manufacturing apparatus including: a main body having an ink ejector ejecting an ink containing an organic light-emitting material; an ink supplier including a light-transmissive tube forming at least a part of an ink transport path connecting a tank containing the ink and the ink ejector; an exposure light amount sensor detecting an amount of light from the lighting device to which the light-transmissive tube is exposed; a display displaying information for a user; and a controller causing the display to display information urging removal of the ink inside the ink transport path when a total exposure amount ET (lux×hours) satisfies ET≥$\alpha \times 17500$ where $\alpha$ is a constant satisfying $\alpha \geq 1$, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

In the organic light-emitting device manufacturing apparatus pertaining to another aspect of the present invention, the ink inside the ink transport path is removed when the total exposure amount ET becomes equal to or greater than $\alpha \times 17500$ (maximum total exposure amount in terms of ink degradation). Accordingly, the organic light-emitting device manufacturing apparatus pertaining to another aspect of the present invention ensures that ink having undergone degradation exceeding a permissible range is not used in the manufacturing of organic light-emitting devices, and thus ensures that organic light-emitting devices that are manufactured have excellent quality.

In the organic light-emitting device manufacturing apparatus pertaining to another aspect of the present invention, $\alpha$ may satisfy $\alpha = 1$.

This means that the ink inside the ink transport path is removed when the total exposure amount ET becomes equal to or greater than 17500, which is the strictest maximum total exposure amount. Accordingly, the organic light-emitting device manufacturing apparatus pertaining to another aspect of the present invention most certainly ensures that ink having undergone degradation exceeding the permissible range is not used in the manufacturing of organic light-emitting devices, and thus ensures that organic light-emitting devices that are manufactured have excellent quality.

In the organic light-emitting device manufacturing apparatus pertaining to another aspect of the present invention, $\alpha$ may satisfy $\alpha = Cw/Ct$, where Cw denotes a total volume of the ink transport path, and Ct denotes a volume of the light-transmissive tube.

Defining α as described above results in the management of ink degradation being performed by using a more practical total exposure amount ET that is calculated by totaling only exposure of the light-transmissive tube to light while the ink is inside the light-transmissive tube. Accordingly, defining α as described above suppresses, for example, the risk of ink whose degradation is still within the permissible range being removed and wastefully discarded and the risk of ink replacement where old ink is removed and replaced with new ink being performed at an unnecessarily high frequency. Thus, defining α as described above contributes to a reduction in cost and an increase in productivity.

In the organic light-emitting device manufacturing apparatus pertaining to another aspect of the present invention, the organic light-emitting device manufacturing apparatus may be switchable between a manufacturing mode and a maintenance mode, the organic light-emitting device manufacturing apparatus manufacturing organic light-emitting devices in the manufacturing mode and being under maintenance in the maintenance mode, and the organic light-emitting device manufacturing apparatus may further include a light-blocking member placed between the lighting device and the light-transmissive tube while the organic light-emitting device manufacturing apparatus is in the maintenance mode.

According to the above, even when the lighting device is turned on to carry out maintenance, the amount of light to which the light-transmissive tube is exposed while the maintenance is being carried out can be reduced, and thus ink degradation can be suppressed.

Another aspect of the present invention is an organic light-emitting device manufacturing apparatus including a tube inside which an ink containing an organic light-emitting material flows, wherein the organic light-emitting device manufacturing apparatus manufactures an organic light-emitting device including a light-emitting layer containing the ink, and the tube is a light-blocking tube.

Accordingly, in the organic light-emitting device manufacturing apparatus pertaining to another aspect of the present invention, degradation of ink loaded to the manufacturing apparatus due to exposure of the ink to light is suppressed.

In the organic light-emitting device manufacturing apparatus pertaining to another aspect of the present invention, the tube may include a first layer made of light-transmissive material and a second layer made of light-blocking material and covering the first layer from outside.

This structure enables using a material having high solvent resistance and low impurity content for the first layer that comes in direct contact with ink, and suppressing ink degradation due to exposure to light by blocking light to the ink with the second layer.

In the organic light-emitting device manufacturing apparatus pertaining to another aspect of the present invention, the first layer may be made of fluorine resin.

This structure enables using a fluorine resin, which is a material having high solvent resistance and low impurity content, for the first layer. This suppresses tube degradation due to ink solvent, and suppresses the risk of the ink being affected by impurities.

The following describes the present invention based on specific embodiments and modifications thereof to provide explanation of the structure and the effects of the present invention.

Note that the embodiments and modifications described in the following are mere examples used to provide clear explanation of the structure and the effects of aspects of the present invention. Thus, other than essential description provided therein, the embodiments and modifications shall be considered as describing non-limiting examples of the present invention.

<Process of Conception of Forms of Implementation of Present Invention>

It is conventionally known that among inks containing organic light-emitting materials, used in the manufacturing of organic light-emitting devices, some undergo degradation when exposed to light. In view of this, manufacturing of organic light-emitting devices using an ink undergoing such degradation is performed by placing the apparatus for manufacturing the organic light-emitting devices in a dark environment where outside light is blocked and lighting is turned off. However, there are situations where the lighting needs to be turned on for a worker to carry out work such as conducting maintenance of the manufacturing apparatus and dealing with a problem having occurred with the manufacturing apparatus.

Figure 1B:
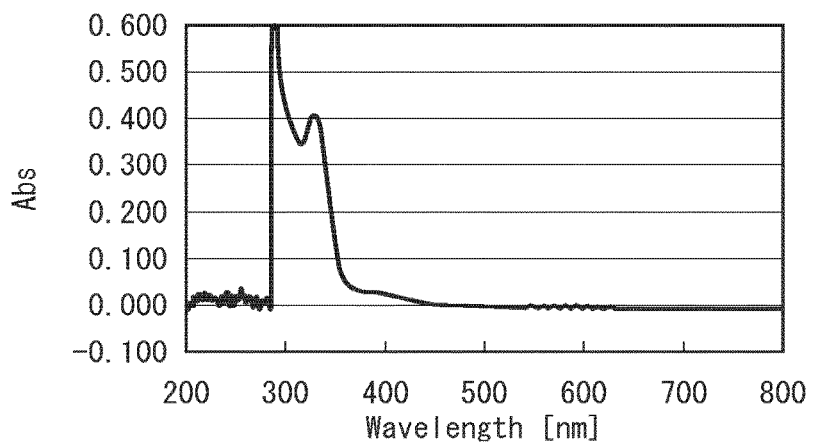
FIG. 1B illustrates one example of a light absorption spectrum of an ink for light-emitting color G.

Meanwhile, it is also known that an ink absorbs specific wavelengths of light and undergoes degradation when exposed to light components with the specific wavelengths. For example, FIG. 1A illustrates one example of a light absorption spectrum of an ink for the color red (R), and FIG. 1B illustrates one example of a light absorption spectrum of an ink for the color green (G). The absorption spectrums illustrated in FIGS. 1A and 1B illustrate that the ink for R and the ink for G both absorb light components with wavelengths 500 nm or shorter to a great extent, and absorbs light components with wavelengths within a range from 280 nm to 450 nm to a particularly great extent.

Figure 1C:
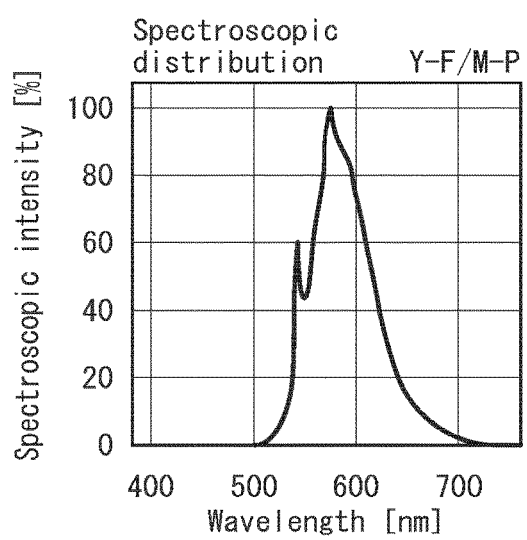
FIG. 1C illustrates a spectral distribution of light from a yellow lamp.

In view of this, a measure is typically taken of using a yellow lamp instead of a white fluorescent lamp that is more widely used, to provide lighting while conducting maintenance and while dealing with a problem occurring having occurred. As illustrated in FIG. 1C, light from a yellow lamp is constituted of light components with wavelengths of 500 nm or longer. In other words, light from a yellow lamp does not include light components with wavelengths shorter than 500 nm.

However, ink degradation cannot be completely avoided even under an environment where ink is exposed to only yellow light. This is because an absorption spectrum of an ink also has a peak within a wavelength region of 500 nm and longer, however small the peak may be, as illustrated in FIGS. 1A and 1B.

Further, a manufacturing apparatus for manufacturing organic light-emitting devices having a light-emitting layer that is formed through application of an ink using inkjet application typically includes a tube for transporting the ink contained in a tank to an inkjet head. Here, the tube also needs to move as the inkjet head moves from one end to another of a large substrate, and thus, the tube needs to be made of a flexible material. Further, the tube also needs to have characteristics such as high solvent resistance and low impurity content. Examples of materials satisfying these requirements include fluorine resins such as: tetrafluoroethylene-perfluoroalkoxyethylene copolymer (PFA); ethylene-tetrafluoroethylene copolymer (ETFE); thermoplastic fluorine resin composed of the three monomers tetrafluoroethylene, hexafluoropropylene, and vinylidene (THV); and polyvinylidene difluoride (PVDF). However, these resins are all light transmissive, and due to this, tubes made of such resins, when used to transport ink and exposed to yellow light, would allow the yellow light to pass through and arrive at the ink inside the tube, which leads to degradation of the ink.

Although one measure for resolving this issue would be using a tube made of metal and thus blocking much light as the tube for transporting ink instead of a tube made of such resin material. However, this is also problematic, because a metal tube does not have a sufficient level of flexibility and thus, would not be able to move along with the inkjet head. Another measure would be using a resin or a rubber material that blocks light, examples of which include vinyl chloride resin, polystyrene, butyl rubber, and urethane, instead. However, a tube made of such material is also not desirable, for example, for not having a sufficient level of flexibility and for containing undesirable impurities.

For such reasons, the present inventors, in cooperation with one or more others, arrived at an organic light-emitting device manufacturing method in which a tube made of a light-transmissive material, such as a fluorine resin, is used, and in which ink quality management is carried out so that the risk of defective organic light-emitting devices being manufactured is suppressed.

<<Embodiment 1>>

[1. Overall Structure of Organic Light-Emitting Device Manufacturing Apparatus]

Figure 2:
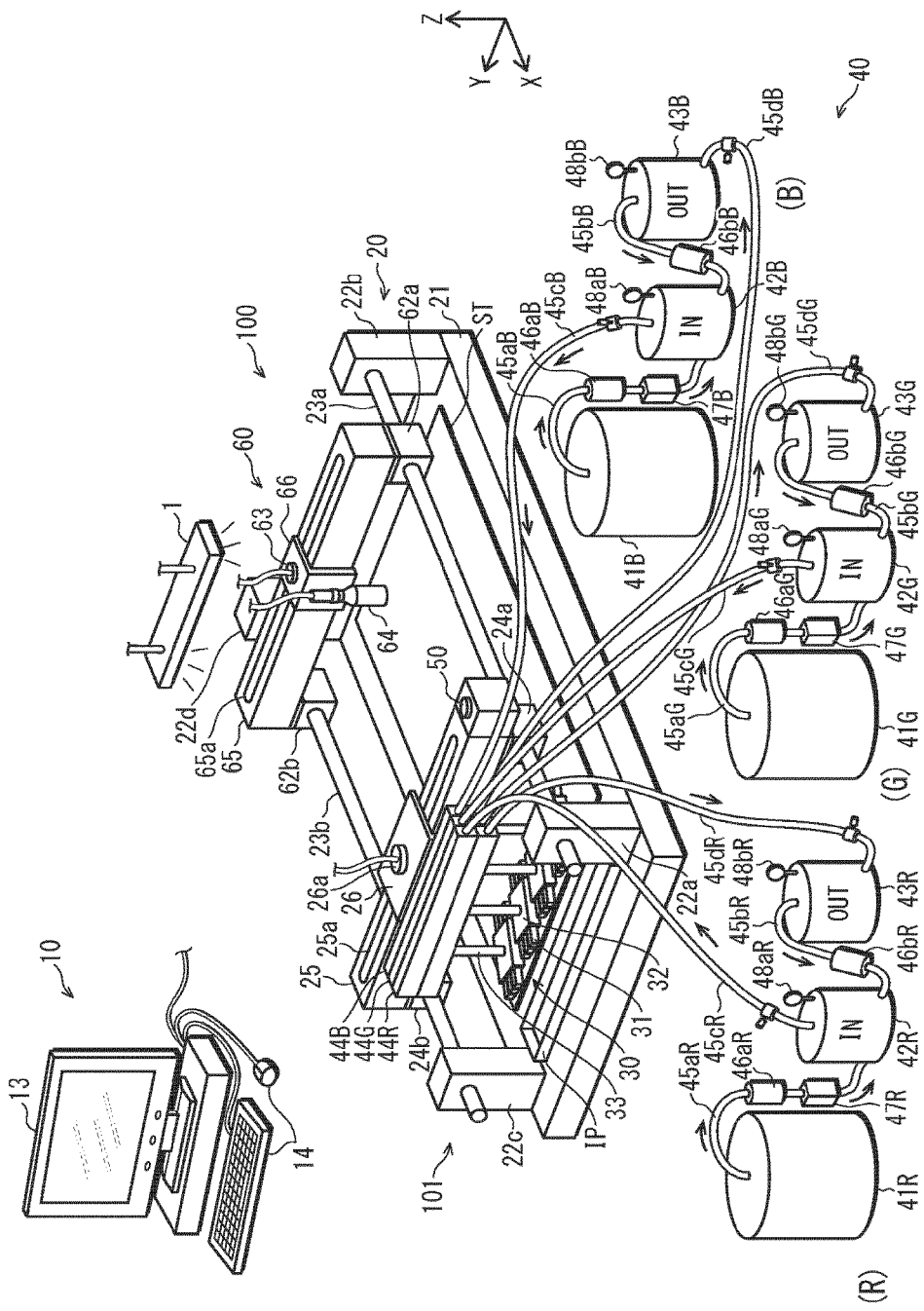
FIG. 2 is a perspective diagram schematically illustrating the external appearance and the structure of an organic light-emitting device manufacturing apparatus 100 pertaining to embodiment 1.
Figure 3:
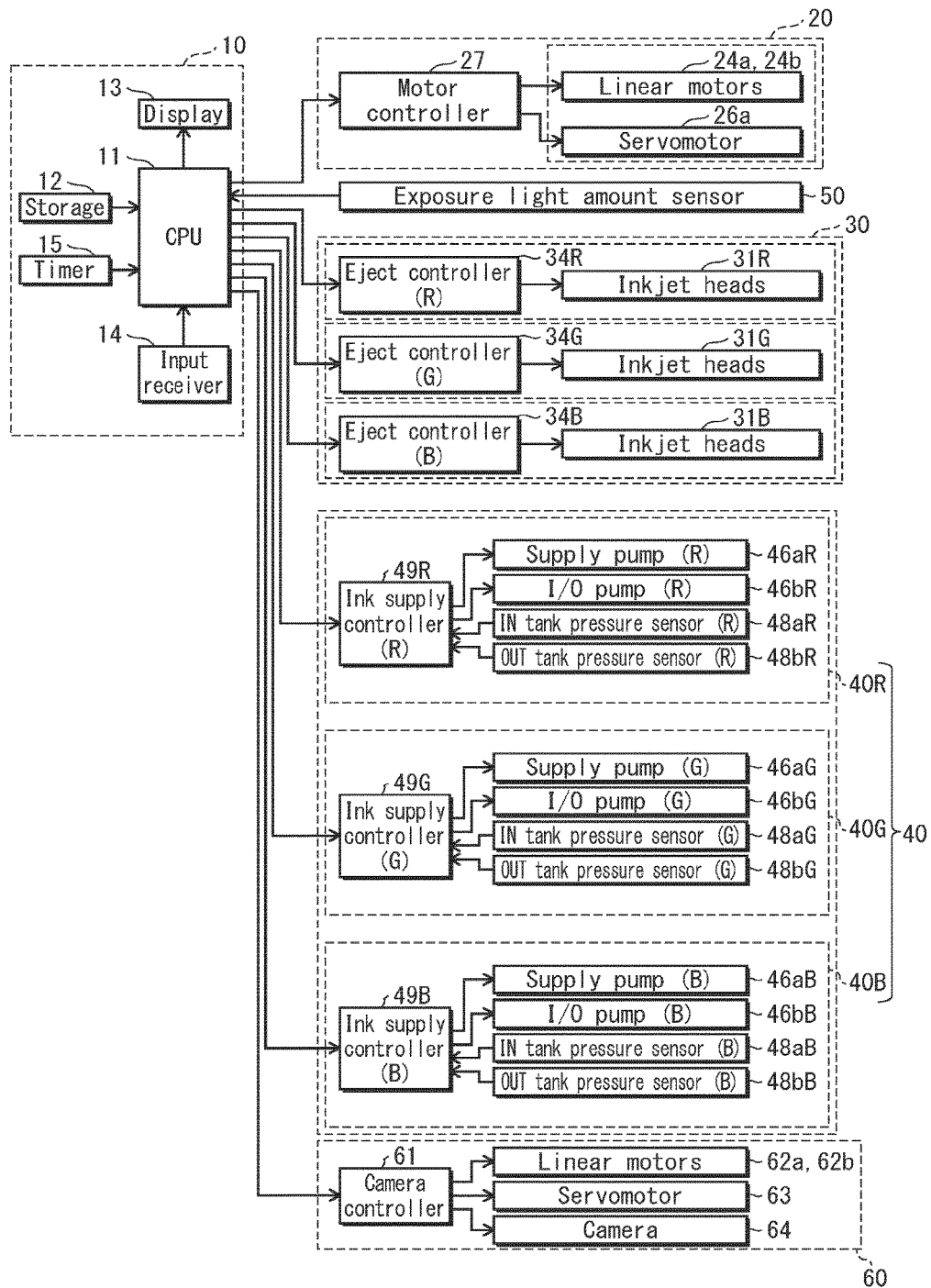
FIG. 3 is a diagram illustrating functional blocks of the organic light-emitting device manufacturing apparatus pertaining to embodiment 1.

The following describes the overall structure of an organic light-emitting device manufacturing apparatus pertaining to embodiment 1, which is one aspect of the present invention, with reference to FIGS. 2 and 3. Note that in the following, when the organic light-emitting device manufacturing apparatus includes the same type of component for each of the light-emission colors R, G, and B, the letters R, G, and B are appended to the reference symbol indicating the type of component to distinguish light-emission color. Meanwhile, when there is no need to distinguish light-emission color, the letters R, G, and B are not appended to the reference symbol indicating the type of component.

FIG. 2 is a perspective diagram illustrating the external appearance and the overall structure of an organic light-emitting device manufacturing apparatus 100 (in the following, referred to as manufacturing apparatus 100) pertaining to embodiment 1. FIG. 3 is a diagram illustrating functional blocks of the manufacturing apparatus 100. As illustrated in FIGS. 2 and 3, main components of the manufacturing apparatus 100 include: a control unit 10; a work table 20; an ink ejector unit 30; ink supply units 40; an exposure light amount sensor 50; and an observation unit 60. Note that a part of the manufacturing apparatus 100 including all of these components other than the ink supply units 40 is referred to in the following as a manufacturing apparatus main body 101. Further, the observation unit 60 need not be included in the manufacturing apparatus 100, and may be separated from the manufacturing apparatus 100.

<Control Unit>

Main components of the control unit 10 include: a controller 11; a storage 12 (includes a large capacity storage such as a hard disk drive (HDD)); a display 13; an input receiver 14; and a timer 15.

The controller 11 is a central processing unit (CPU) that executes various types of processing related to control of the manufacturing apparatus 100. The control unit 10 may be implemented by using a personal computer (PC).

The storage 12 includes: a read-only memory (ROM) storing various programs related to control of the manufacturing apparatus 100; a volatile main memory, such as a random access memory (RAM) that serves as a temporary storage for data such as various parameters related to control of the manufacturing apparatus 100 that are read from the ROM and are used in processing related to control of the manufacturing apparatus 100; a non-volatile sub-memory, such as an electrically erasable programmable read-only memory (EEPROM), that stores information such as a total exposure amount ET. Further, the storage 12 may also include a large capacity storage such as a HDD.

The storage 12 stores, for example, programs related to control of the work table 20, the ink ejector unit 30, the ink supply units 40, and the observation unit 60, all of which are connected to the control unit 10. Control of the manufacturing apparatus 100 is achieved by the controller 11 executing predetermined types of control based on instructions that a user, an administrator, or the like inputs to the input receiver 14 and the various programs stored in the storage 12 related to the control of the manufacturing apparatus 100.

The display 13 is a display device that displays various types of information related to operation of the manufacturing apparatus 100. Specifically, the display unit 13 is implemented by using a display device such as a liquid crystal display or an organic EL display.

The input receiver 14 is a device that receives input of information causing the controller 11 to execute and switch between various types of control, from the user, the administrator, or the like. Specifically, the input receiver 14 is implemented by using a keyboard and/or a computer mouse.

The timer 15 is a device that measures time. The timer 15 may be integrated into the controller 11 as a function of the controller 11.

<Work Table>

As illustrated in FIG. 2, the work table 20 is a so-called gantry table. The work table 20 includes a base 21, stands 22a, 22b, 22c, 22d standing at four corners of the upper surface of the base 21, a stage ST on which an application-target substrate is placed to be located at the center of the base 21, and an ink pan IP (a plate-like container) receiving ink ejected immediately before actual application in an operation for stabilizing ink ejection characteristics.

The stands 22a and 22b, together, support a guide shaft 23a that extends along the lengthwise direction of the base 21 (X-axis direction). Further, the stands 22c and 22d together support a guide shaft 23b that extends along the lengthwise direction of the base 21 (X-axis direction). The guide shafts 23a and 23b are supported to be parallel to one another. Linear motors 24a and 24b have the guide shafts 23a and 23b inserted therein, respectively. Further, a gantry 25 is mounted on the linear motors 24a and 24b to be suspended across the linear motors 24a and 24b and extend over and across the stage ST. Thus, when the linear motors 24a and 24b are driven at the same speed in the same direction, the gantry 25 slides in the lengthwise direction of the guide shafts 23a and 23b (X-axis direction).

The gantry 25 has a movable member (carriage) 26 attached thereto. The movable member 26 is a mount having an L shape. The movable member 26 is equipped with a servomotor (movable member motor) 26a whose shaft tip has an undepicted gear. The gear of the shaft of the movable member 26 engages with a guide groove 25a that is disposed in the gantry 25 to extend in the lengthwise direction of the gantry 25 (Y-axis direction). The guide groove 25a has disposed therein a rack that has extremely small teeth and that extends along the lengthwise direction of the guide groove 25a (Y-axis direction). The teeth of the rack engage with the teeth of the gear of the shaft of the movable member 26 to form a so-called rack and pinion mechanism. Thus, by driving the servomotor 26a, the movable member 26 can be driven to move accurately back and forth along the Y-axis direction.

The movable member 26 has the ink ejector unit 30 attached thereto. Ink application by the ink ejector unit 30 with respect to the application target substrate (also be referred to as the scanning of the application target substrate by the ink ejector unit 30) is performed by combining the two following movements. The first movement is a movement where the gantry 25 is moved in the lengthwise direction of the guide shafts 23a and 23b with the movable member 26 fixed to the gantry 25. The second movement is a movement where the movable member 26 is moved in the lengthwise direction of the gantry 25 (Y-axis direction) without moving the gantry 25. Note that the first direction of the scanning by the ink ejector unit 30 (referred to as a main scanning direction in the following) is the row direction (X-axis direction), and the second direction of the scanning by the ink ejector unit 30 (referred to as a sub scanning direction in the following) is the column direction (Y-axis direction).

Note that the linear motor 24a, the linear motor 24b, and the servomotor 26a are each connected to a motor controller 27 that directly controls these motors. The motor controller 27 is connected to the controller 11 of the control unit 10. Control of the manufacturing apparatus 100 is achieved by the controller 11 reading one or more control programs and controlling the linear motor 24a, the linear motor 24b, and the servomotor 26a via the motor controller 27.

<Ink Ejector Unit>

The ink ejector unit 30 has a plurality of inkjet heads 31. Each inkjet head 31 includes an array of conventional piezoelectric nozzles. The plurality of inkjet heads 31 are put into one or more groups each including at least two of the inkjet heads 31. Further, each group of inkjet heads 31 is held by one holder 32. The group of inkjet heads 31 that each holder 32 holds is fixed to the movable member 26 via an arm 33. In the present embodiment, the ink ejector unit 30 has four groups of inkjet heads 31 that are each fixed to the movable member 26 via one arm 33. Each group of inkjet heads 31 is held by one holder 32, and includes three inkjet heads 31, one for each of the colors R, G, and B. The inkjet heads 31 of the same color (R, G, or B) that are included in different groups of inkjet heads 31 are connected to a single eject controller 34 of the corresponding color. Thus, color-by-color control of ink ejection is achieved. The eject controllers 34R, 34G, and 34B are each implemented, for example, by using a microcomputer.

<Ink Supply Units>

As illustrated in FIG. 2, the ink supply units 40 include one ink supply unit for each of the colors R, G, and B (i.e., the ink supply units 40 includes ink supply units 40R, 40G, and 40B). The ink supply units 40R, 40G, and 40B, while differing from one another in term of ink light-emission color, have the same basic structure. Thus, the following describes the structure of the ink supply units 40R, 40G, and 40B by focusing on the ink supply unit 40R.

The ink supply unit 40R includes a supply tank 41R, an IN tank 42R, an OUT tank 43R, and a distribution tank 44R. Each of these tanks is a container that accommodates ink. The distribution tank 44R is attached to the movable member 26, and is connected to the ink ejector unit 30.

The supply tank 41R and the IN tank 42R are connected to one another via a tube 45aR. The IN tank 42R and the OUT tank 43R are connected to one another via a tube 45bR. The IN tank 42R and the distribution tank 44R are connected to one another via a tube 45cR. The OUT tank 43R and the distribution tank 44R are connected to one another via a tube 45dR.

The tubes 45aR, 45bR, 45cR, and 45dR are made of a fluorine resin. The tube 45aR has a supply pump 46aR and a filter 47R connected therealong. The tube 45bR has an input/output (I/O) pump 46bR connected therealong.

Further, the IN tank 42R has a pressure sensor 48aR connected thereto. The pressure sensor 48aR detects ink pressure inside the IN tank 42R. Similarly, the OUT tank 43R has a pressure sensor 48bR connected thereto. The pressure sensor 48bR detects ink pressure inside the OUT tank 43R.

The pressure sensor 48aR, the pressure sensor 48bR, and the I/O pump 46bR are each connected to an ink supply controller 49R. The ink supply controller 49R is implemented, for example, by using a microcomputer. The ink supply controller 49R controls the I/O pump 46bR based on the ink pressure inside the IN tank 42R, which is detected by the pressure sensor 48aR, and the ink pressure inside the OUT tank 43R, which is detected by the pressure sensor 48bR. Thus, the ink supply control 49R creates ink flow from the OUT tank 43R to the IN tank 42R via the tube 45bR, and thereby generates a difference between ink pressure inside the IN tank 42R and ink pressure inside the OUT tank 43R. This difference in ink pressure causes ink to flow from the IN tank 42R into the distribution tank 44R via the tube 45cR. The ink then returns to the OUT tank 43R from the distribution tank 44R via the tube 45dR. Thus, the IN tank 42R, the OUT tank 43R, the distribution tank 44R, and the tubes 45bR, 45cR, and 45dR together form an ink transport path 450R in which ink circulates at all times.

Note that in the manufacturing of an organic light-emitting device, a certain amount of the ink inside the distribution tank 44R is consumed by being ejected from the inkjet heads 31 of the ink ejector unit 30. Thus, the supply pump 46aR causes the same amount of ink as consumed to be supplied from the supply tank 41R to the IN tank 42R via the tube 45aR. Ink newly supplied in such a manner passes through the filter 47R, where impurities such as dust are removed.

Further, while the manufacturing apparatus 100 is in standby and is not carrying out manufacturing of organic light-emitting devices (e.g., while the manufacturing apparatus is in maintenance), ink remains circulating in the ink transport path 450R so that hardening of ink does not take place. However, should ink remain circulating in the ink transport path 450R without being ejected from the nozzles of the inkjet heads 31 for a long amount of time, nozzle clogging may occur due to drying and hardening of ink. In order to prevent such nozzle clogging from occurring while the manufacturing apparatus 100 is in standby, the ink surface (meniscus) inside each nozzle outlet is caused to oscillate, in addition to the ink being caused to continue circulating in the ink transport path 450R as described above.

<Exposure Light Amount Sensor>

The exposure light amount sensor 50 is a photoelectric converter that converts light that it receives into electricity. In the present embodiment, the exposure light amount sensor 50 is implemented by using a surface mount device (SMD) photodiode. Further, in the manufacturing apparatus 100 pertaining to the present embodiment, the exposure light amount sensor 50 is attached to a lengthwise-direction (Y-axis direction) end of the gantry 25 where the tubes 45 (the tubes 45a, the tubes 45b, the tubes 45c, and the tubes 45d) are arranged. While the position of the exposure light amount sensor 50 is not limited to this, it is beneficial to dispose the exposure light amount sensor 50 near the tubes 45 to measure the amount of light to which the tubes 45, which are light transmissive, are exposed. Meanwhile, it should be noted that the tubes 45c and 45d move along with the ink ejector unit 30 in the manufacturing of an organic light-emitting device. Taking this into consideration, it is necessary to dispose the exposure light amount sensor 50 so as not to collide with the tubes 45c and the tubes 45d and so that the exposure light amount sensor 50 is capable of receiving light without being covered by the tubes 45c and the tubes 45d, even when the tubes 45c and 45d move as described above.

<Observation Unit>

In terms of function, the observation unit 60 includes: a camera controller 61; linear motors 62a and 62b; a servomotor 63; and a camera 64, as illustrated in FIG. 3. The camera 64 is a conventional charge-coupled device (CCD) camera, and is for detecting bad nozzles of the inkjet heads 31.

The linear motors 62a and 62b have the guide shafts 23a and 23b inserted therein, respectively. Further, a gantry 65 is mounted on the linear motors 62a and 62b to be suspended across the linear motors 62a and 62b and span the stage ST. The gantry 65 has a guide groove 65a disposed therein.

The linear motors 62a and 62b have the same basic structure as the linear motors 24a and 24b, and the servomotor 63 has the same basic structure as the servomotor 26a. Further, the gantry 65 and the guide groove 65a have the same basic structures as the gantry 25 and the guide groove 25a, respectively.

The gantry 65 has a movable member (carriage) 66 attached thereto. The movable member 66 is a mount having an L shape. The movable member 66 is equipped with the servomotor 63 (movable member motor). The movable member 66 has the same basic structure as the movable member 26, differing from the movable member 26 only for having a different Y-axis direction length. The camera 64 is attached to the movable member 66. The camera controller 61 controls the linear motor 62a, the linear motor 62b, and the servomotor 63 to move the camera 64 to a desired position over the stage ST.

The detection of bad nozzles is performed by causing the inkjet heads 31 to eject ink onto a liquid repellent substrate prepared for testing, and capturing images of the ink droplets having landed on the liquid repellent substrate by using the camera 64. The detection of bad nozzles is performed each time a predetermined number (for example, one hundred) of organic light-emitting devices have been manufactured.

The camera controller 61 is connected to the controller 11, and the controller 11 provides the camera controller 61 with instructions causing the controller 11 to perform image capturing at a predetermined timing.

Note that the observation unit 60 may be included in the manufacturing apparatus main body 101 or may not be included in the manufacturing apparatus main body 101, in which case the observation unit 60 is a separate unit.

<Lighting Device>

In addition, a lighting device 1 is provided. The lighting device 1 emits light constituted of light components with wavelengths of 500 nm or greater. For example, the lighting device 1 is a fluorescent lamp emitting yellow light.

Note that the lighting device 1 is not included in the manufacturing apparatus 100.

[2. Total Exposure Amount and Device Degradation]

It is conventionally known that ink undergoes degradation when exposed to light. Further, it is conventional to carry out manufacturing of organic light-emitting devices under light (e.g., yellow light) constituted of light components with wavelengths of 500 nm or greater in order to suppress such ink degradation. However, ink degradation in fact occurs even in such an environment. Then, the question is how much light causes ink to undergo degradation to a level making the ink no longer appropriate for use.

The present inventors, in cooperation with one or more others, conducted an experiment to determine the degradation level of organic light-emitting devices manufactured under different exposure light amounts and with different exposure time amounts. In the experiment, five test samples (implementation samples 1 through 3 and comparative samples 1 and 2) were prepared, each under a different combination of exposure light amount and exposure time amount, and the luminous efficacy value and the LT75 value of each of the five test samples were specified. Note that an LT75 value is a value indicating the result of an LT75 test, which is one test method of determining device lifespan that involves causing an organic light-emitting device to emit light continuously through continuous voltage application and determining the amount of time until the luminance of the organic light-emitting device decreases to 75% of the initial luminance (100%).

The test samples were each prepared as follows. First, a light-transmissive tube containing ink was exposed to light constituted of light components with wavelengths of 500 nm or greater for a predetermined amount of time (exposure time amount), with the illuminance/brightness of the light set to a predetermined level (exposure light amount). Here, the tube used was made of the same material (fluorine resin in the present embodiment) as at least the tubes 45c and 45d, among the tubes 45a, 45b, 45c, 45d. The exposure to light was performed without the ink circulating inside the tube; i.e. with the ink in stationary state inside the tube. Subsequently, the ink after exposure to light was set to the manufacturing apparatus 100, and manufacturing of an organic light-emitting device was carried out by causing the ink ejector unit 30 to apply the ink onto a substrate. Then, the luminous efficacy value and the LT75 value of the organic light-emitting device so prepared were determined. The determination of luminous efficacy value was performed by applying a current of 10 mA/cm$^2$ to the organic light-emitting device. The determination of the LT75 value was performed by causing the organic light-emitting device to emit light continuously by applying a constant current causing the organic light-emitting device to initially emit light with a luminance of 8000 cd/m$^2$, and measuring the amount of time after which the luminance of the organic light-emitting device decreased to 75% (i.e., 6000 cd/m$^2$) of the initial luminance.

FIG. 4 illustrates, for each of the test samples, the combination of the exposure light amount E (lux) and the exposure time amount T (hours) in the preparation of the test sample, the total exposure amount ET (lux×hours) in the preparation of the test sample, and the luminous efficacy value (cd/A) and the LT75 value (hours) for the test sample.

Implementation sample 1 was prepared by using ink after light exposure with an exposure light amount E of 10 lux for an exposure time amount T of 300 hours (thus, the total exposure amount ET for the sample was 3000 lux×hours. The luminous efficacy value of implementation sample 1 was 37.9 cd/A, and the LT75 value for implementation sample 1 was 24.1 hours.

Implementation sample 2 was prepared by using ink after light exposure with an exposure light amount E of 50 lux for an exposure time amount T of 250 hours (thus, the total exposure amount ET for the sample was 12500 lux×hours). The luminous efficacy value for implementation sample 2 was 36.8 cd/A, and the LT75 value for implementation sample 2 was 23.5 hours.

Implementation sample 3 was prepared by using ink after light exposure with an exposure light amount E of 100 lux for an exposure time amount T of 150 hours (thus, the total exposure amount ET for the sample was 15000 lux×hours). The luminous efficacy value for implementation sample 3 was 36.5 cd/A, and the LT75 value for implementation sample 3 was 23.3 hours.

Comparative sample 1 was prepared by using ink after light exposure with an exposure light amount E of 250 lux for an exposure time amount T of 150 hours (thus, the total exposure amount ET for the sample was 37500 lux×hours). The luminous efficacy value for comparative sample 1 was 28.4 cd/A, and the LT75 value for comparative sample 1 was 7.4 hours.

Comparative sample 2 was prepared by using ink after light exposure with an exposure light amount E was 700 lux for an exposure time amount T of 150 hours (thus, the total exposure amount ET for the sample was 105000 lux×hours). The luminous efficacy value for comparative sample 2 was 20.4 cd/A, and the LT75 value for comparative sample 2 was 2.2 hours.

Figure 5A:
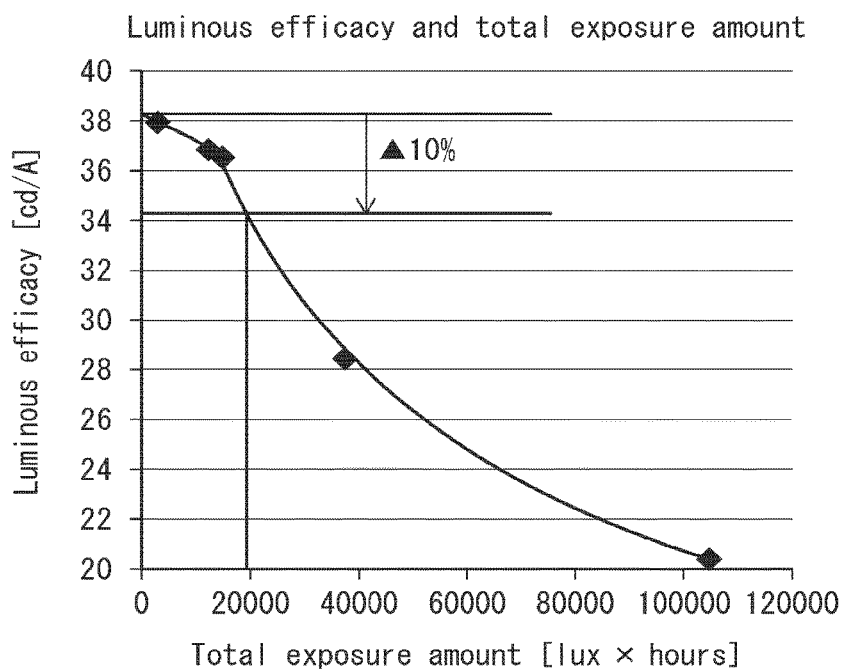
FIG. 5A shows a graph acquired by plotting the results of the luminous efficacy test in FIG. 4.
Figure 5B:
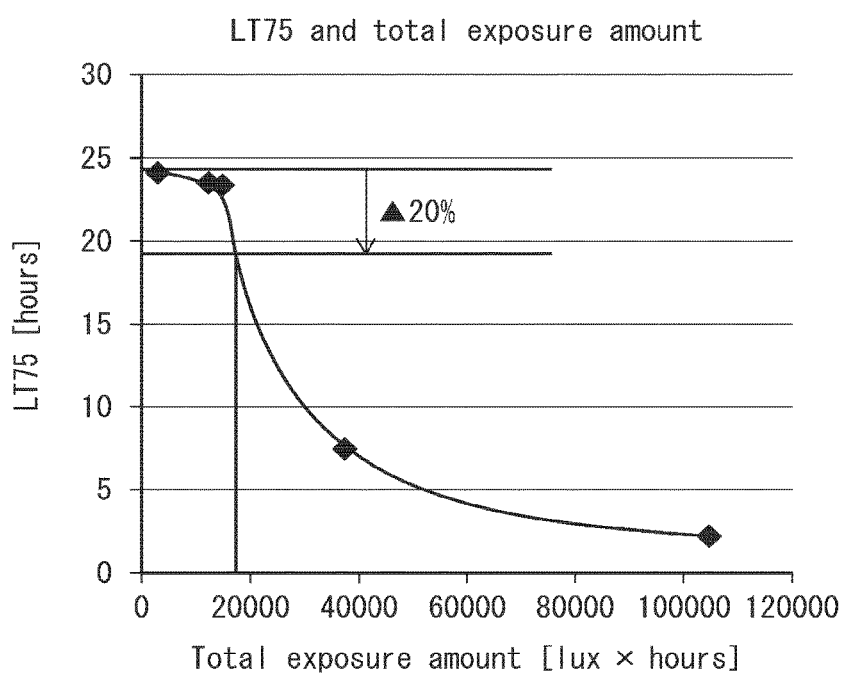
FIG. 5B shows a graph acquired by plotting the results of the lifespan test in FIG. 4.

FIG. 5A is a graph plotting the luminous efficacy values and the total exposure amounts ET for the five test samples. FIG. 5B is a graph plotting the LT75 values and the total exposure amounts ET for the five test samples. Further, the solid-line curves in FIGS. 5A and 5B are approximation curves connecting the plotted points.

<Total Exposure Amount and Luminous Efficacy>

As can be seen from FIGS. 4 and 5A, not much difference in luminous efficacy value was observed among the implementation samples 1 through 3 (for which the total exposure amount ET was within the range of 3000 to 15000 lux× hours). Meanwhile, the luminous efficacy value for comparative example 1 (for which the total exposure amount ET was 37500 lux×hours) was much lower than that for each of the implementation samples 1 through 3, and the luminous efficacy value for comparative example 2 was even lower. Further, the inflection point of the approximation curve in FIG. 5A exists between implementation sample 3 and comparative example 1. This means that a point where luminous efficacy rapidly decreases exists at some point between these two samples.

Here, when regarding as the initial luminous efficacy value the luminous efficacy value 38.2 cd/A where the approximation curve crosses the Y axis in FIG. 5A, or that is, the expected luminous efficacy value when the total exposure amount ET equals 0 lux×hours, the total exposure amount ET with which a 10% decrease in luminous efficacy value from the initial value is observed is approximately 18000 lux×hours. Accordingly, it can be considered that in terms of luminous efficacy, ink degradation is within a permissible range not bringing about much of a problem in device quality if the total exposure amount ET is 18000 lux×hours or smaller.

<Total Exposure Amount and LT75>

As can be seen from FIGS. 4 and 5B, not much difference in LT75 value was observed among the implementation samples 1 through 3 (for which the total exposure amount ET was within the range of 3000 to 15000 lux×hours). Meanwhile, the LT75 value for comparative example 1 (for which the total exposure amount ET was 37500 lux×hours) was much lower than that for each of the implementation samples 1 through 3, and the LT75 value for comparative example 2 was even lower. Further, similar to the case of luminous efficacy, the inflection point of the approximation curve in FIG. 5B exists between implementation sample 3 and comparative example 1. This means that a point where luminous efficacy rapidly decreases exists between these two samples.

Here, when regarding as the initial LT75 value the LT75 value 24.2 cd/A where the approximation curve crosses the Y axis in FIG. 5B, or that is, the expected LT75 value when the total exposure amount ET equals 0 lux×hours, the total exposure amount ET with which a 20% decrease in the LT75 value from the initial value is observed is approximately 17500 lux×hours. Accordingly, it can be considered that in terms of LT75, ink degradation is within a permissible range not bringing about much of a problem in device quality if the total exposure amount ET is 17500 lux×hours or smaller.

[3. Organic Light-Emitting Device Manufacturing Method]

The results of the experiment above indicate that the risk of defective organic light-emitting devices being manufactured can be suppressed by managing ink quality by controlling the total exposure amount ET.

In the organic light-emitting device manufacturing method pertaining to the present embodiment, the exposure light amount E detected by the exposure light amount sensor 50 at different points is added up, and when the total exposure amount ET becomes equal to or greater than a predetermined value, a judgment is made that ink degradation has exceeded a permissible range. When this judgment is made, the user, the administrator, or the like is urged to replace old ink in an ink transport path 450 with new ink. Specifically, this is achieved by a message (ink replacement warning) urging removal of the ink being displayed on the display 13. Subsequently, the user, the administrator, or the like confirming this message replaces the old ink in the ink transport path 450 with new ink.

Here, replacement of old ink in an ink transport path 450 with new ink involves removal of the old ink from the ink transport path 450 and filling of the ink transport path 450 with the new ink. Further, the term old ink refers to ink which is contained in the ink transport path 450 before the ink replacement and whose degradation has exceeded the permissible range. Meanwhile, the term new ink refers to ink contained in a supply tank 41 until the ink replacement. (Note that the new ink may be from the same lot as the old ink, or may be from a new lot differing from that of the old ink. That is, the ink replacement may involve simply supplying new ink from the same lot as the old ink or may involve replacing the old ink with new ink of a different lot.) This similarly applies to each of embodiment and modification described later in the present disclosure.

According to this manufacturing method, ink having undergone degradation is not used in the manufacturing of organic light-emitting devices. Thus, this manufacturing method suppresses the risk of defective organic light-emitting devices being manufactured and thus ensures that organic light-emitting devices with excellent quality are manufactured.

Figure 6:
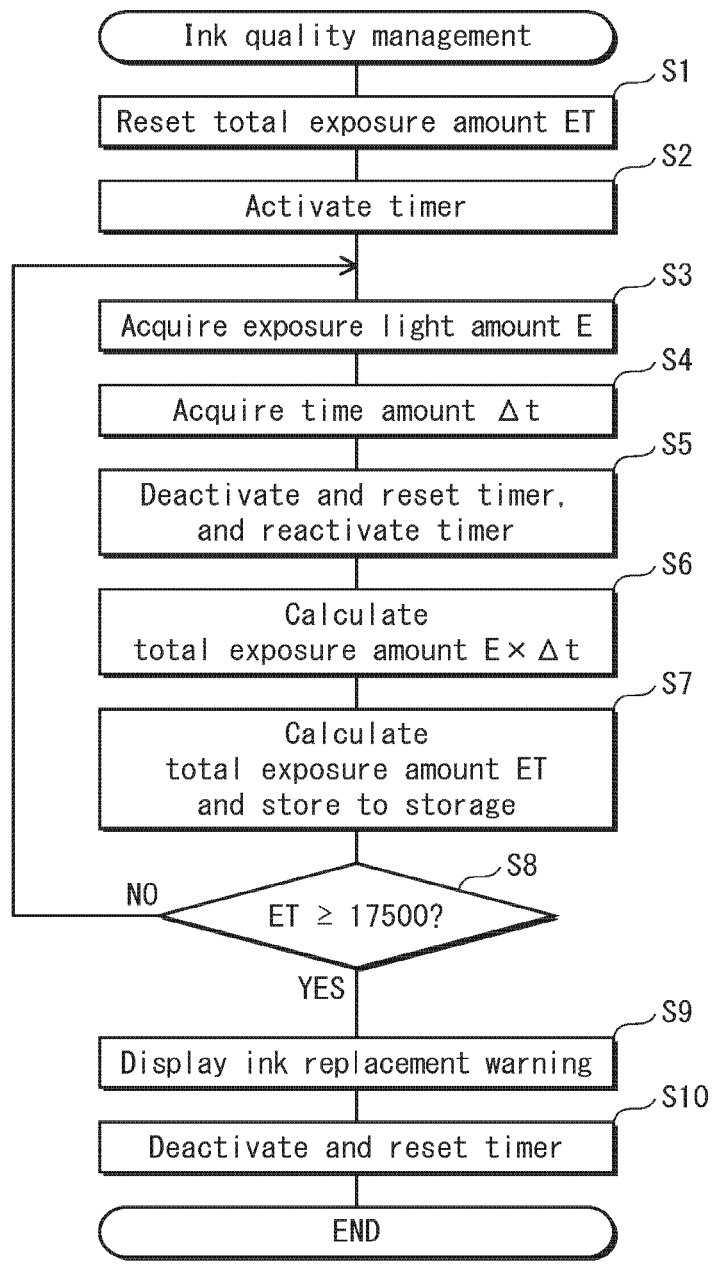
FIG. 6 is a flowchart illustrating ink quality management in an organic light-emitting device manufacturing method pertaining to embodiment 1.

The following describes the organic light-emitting device manufacturing method pertaining to the present embodiment in more detail, with reference to FIG. 6.

According to the above, ink degradation is considered as being within a permissible range when the total exposure amount ET is 18000 lux×hours or smaller considering the relationship between total exposure amounts EP and the luminous efficacy value. Further, ink degradation is considered as being within a permissible range when the total exposure amount ET is 17500 lux×hours or smaller considering the relationship between total exposure amounts EP and LT75 values. Accordingly, in the present embodiment, ink degradation is considered as being within a permissible range when the total exposure amount ET is 17500 lux×hours or smaller, which is a total exposure amount range satisfying both the two ranges described above.

FIG. 6 is a flowchart illustrating ink quality management that the controller 11 performs in the organic light-emitting device manufacturing method pertaining to embodiment 1.

Note that while not illustrated in any of the drawings, there is a main routine controlling the entire manufacturing apparatus 100. The ink quality management illustrated in FIG. 6 is a sub-routine that is called and executed at a predetermined timing after the manufacturing apparatus 100 is turned on and execution of the main routine is commenced.

When the manufacturing apparatus 100 is turned on and the ink quality management is commenced, the controller 11 first resets the total exposure amount ET currently stored in the storage 12 (Step S1), and then activates the timer 15 (Step S2). When the manufacturing apparatus 100 is being used for the first time, no total exposure amount ET is stored in the storage 12 at the point when the manufacturing apparatus 100 is turned on. Thus, in this case, the controller 11 skips Step S1.

Subsequently, the controller 11 acquires the exposure light amount E detected by the exposure light amount sensor 50 (Step S3), and then acquires a time amount Δt measured by the timer 15 (Step S4).

Subsequently, the controller 11 deactivates the timer 15, resets the timer 15, and then reactivates the timer 15 (Step S5).

Subsequently, the controller 11 calculates a total exposure amount over the time amount Δt, by calculating E×Δt (Step S6). In the present embodiment, the exposure light amount sensor 50 performs the detection of exposure light amount E each time the time amount Δt, which is a very short amount of time (for example, 100 msec), elapses, by sampling the value of current flowing through the photoelectric converter. Setting the time amount Δt equal to the sampling interval of the exposure light amount sensor 50 results in all exposure light amounts detected by the exposure light amount sensor 50 being added up. Accordingly, the accuracy of the total exposure amount ET can be increased.

Although description is provided above that the photoelectric converter performs the sampling each time a time amount of 100 msec elapses, but the sampling interval need not be set to 100 msec. For example, the sampling interval may be set to a shorter amount of time than 100 msec (for example, several milliseconds to several tens of milliseconds), of may be set to a longer amount of time than 100 msec (for example, several hundred milliseconds to several thousand milliseconds).

Subsequently, the controller 11 calculates the total exposure amount ET by adding the total exposure amount E×Δt calculated in Step S6 to the value currently stored in the storage 12, which is a sum of total exposure amounts E×Δt calculated before the current processing loop, and the total exposure amount ET so calculated is stored to the storage 12 (Step S7). Here, note that when Step S7 is reached for the first time since the commencement of the ink quality management, no sum of total exposure amounts E×Δt calculated before the current processing loop exists. Thus, in this case, the controller 11 stores the total exposure amount E×Δt calculated in Step S6 to the storage 12 as the total exposure amount ET.

Subsequently, the controller 11 judges whether or not the total exposure amount ET is 17500 lux×hours or greater (Step S8).

When the total exposure amount ET is 17500 lux×hours or greater, the controller 11, judging that ink degradation has exceeded the permissible range, causes the display 13 to display a message (i.e., the ink replacement warning) urging the user, the administrator, or the like to remove the old ink (YES in Step S8 and then Step S9).

Then, in this case, the controller 11 deactivates and resets the timer 15 (Step S10), and terminates the ink quality management.

Meanwhile, when the total exposure amount ET is not 17500 lux×hours or greater, or that is, when the total exposure amount ET is smaller than 17500 lux×hours in Step S8, the controller 11 returns to Step S3 and acquires the exposure light amount E once again. (No in Step S8 and then Step S3). Then, in this case, the controller 11 repeats the processing from Step S3 to Step S8 until judging in Step S8 that the total exposure amount ET is 17500 lux×hours or greater.

Note that the total exposure amount ET in the processing flow described above can be expressed by using Math. 1 provided in the following.

$$ET = \sum_{\Delta t=0}^{t} E \times \Delta t \qquad \text{[Math. 1]}$$

[Summary of Embodiment 1]

As described up to this point, in the organic light-emitting device manufacturing method pertaining to the present embodiment, the ink replacement warning is displayed on the display 13 when the total exposure amount ET becomes 17500 lux×hours or greater in an environment where light constituted of light components with wavelengths 500 nm or greater is radiated. This makes it possible for a user, an administrator, or the like to promptly conduct ink replacement when ink degradation has exceeded a permissible rage. Accordingly, in the organic light-emitting device manufacturing method pertaining to the present embodiment, the risk of ink whose degradation has exceeded the permissible range being used in the manufacturing of organic light-emitting devices is suppressed, and thus, the risk of defective organic light-emitting devices being manufactured is suppressed.

Further, suppose that a plurality of lighting devices 1, each with a light source, are provided or a single lighting device 1 is provided with a plurality of light sources, and the total number of light sources turned on can be changed. In such a case, the exposure light amount when all light sources are turned on (i.e., all of the plurality of lighting devices 1 are turned on or all of the plurality of light sources in a single lighting device 1 are turned on) differs from the exposure light amount when only some of the light sources are turned on. In view of this, in the organic light-emitting device manufacturing method pertaining to the present embodiment, the exposure light amount E is acquired at a plurality of time points and the exposure light amounts E each corresponding to the time amount Δt, which is a very short amount of time, are added up. Thus, the organic light-emitting device manufacturing method pertaining to the present embodiment achieves accurate calculation of the total exposure amount ET even in the case described above.

Note that the manufacturing method pertaining to the present embodiment, which includes the above-described ink quality management, may be applied to an organic light-emitting device manufacturing system including the organic light-emitting device manufacturing apparatus 100 and the lighting device 1.

<<Embodiment 2>>

In embodiment 1, the ink replacement warning is displayed when the total exposure amount ET becomes 17500 lux×hours or greater. However, the displaying of the ink replacement warning may be performed at a different timing.

Specifically, the experiment in embodiment 1 for analyzing the relationship between total exposure amounts ET and luminous efficacy values/LT75 values was conducted by using ink having been exposed to light while in stationary state inside a tube. However, in the actual manufacturing apparatus 100, ink in an ink transport path 450 is circulating at all times. Thus, it may not be so practical to perform the ink quality management by using the total exposure amount ET of 17500 lux×hours as a threshold in the actual manufacturing apparatus 100.

In embodiment 2, description is provided of a manufacturing method where ink quality management in the manufacturing apparatus 100 is performed in a more practical manner. Note that in the following, in order to avoid the same explanation from being provided multiple times, constituent elements already described in embodiment 1 are provided with the reference signs used in embodiment 1 and description of such constituent elements is not provided.

As described in embodiment 1, an ink inside an ink transport path 450 is circulating at all times. Further, while the tubes 45b, 45c, and 45d are each made of a light transmissive resin material, the IN tank 42, the OUT tank 43, and the distribution tank 44 are each made of a light-blocking member such as a metal light-blocking member. Thus, the ink undergoes degradation when exposed to light while inside the tubes 45b, 45c, and 45d, but is not affected by light when exposed to light while inside the IN tank 42, the OUT tank 43, and the distribution tank 44.

Here, supposing that the total volume of the ink transport path 450 is Cw and that the total of volumes of the light transmissive tubes 45b, 45c, and 45d is Ct, the probability P of ink being inside the tubes 45b, 45c, and 45d in the ink transport path 450 can be expressed as P=Ct/Cw.

Accordingly, the amount of time that an ink circulating inside an ink transport path 450 of the actual manufacturing apparatus 100 receives light from the lighting device 1 can be expressed as P×T=Ct/Cw×T. Based on this, a more practical total exposure amount ET for ink quality management can be acquired by multiplying 17500 and the inverse of P. That is, it is more practical to perform control of displaying the ink replacement warning when the total exposure amount ET becomes 17500×Cw/Ct or greater.

Figure 7:
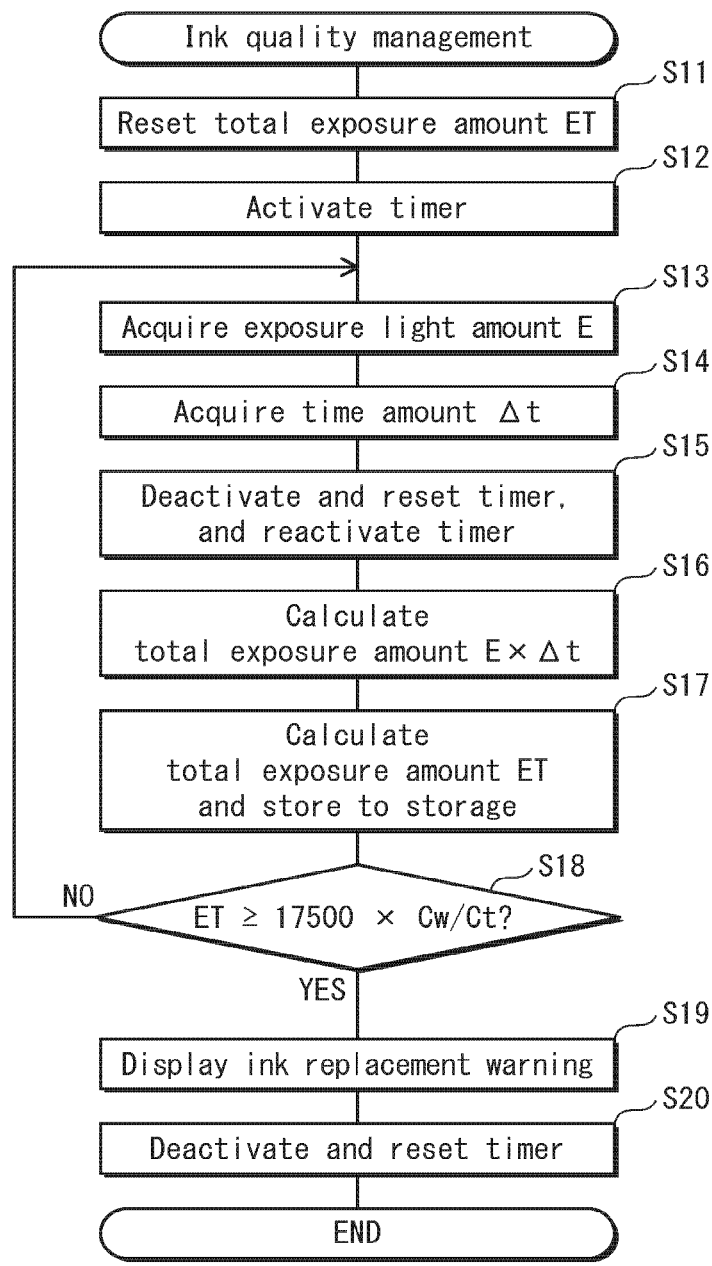
FIG. 7 is a flowchart illustrating ink quality management in an organic light-emitting device manufacturing method pertaining to embodiment 2.

FIG. 7 is a flowchart illustrating ink quality management that the controller 11 performs in the organic light-emitting device manufacturing method pertaining to embodiment 2.

Similar to the ink quality management pertaining to embodiment 1, the ink quality management pertaining to the present embodiment is a sub-routine of the undepicted main routine for controlling the entire manufacturing apparatus 100, and is called and executed at a predetermined timing after execution of the main routine is commenced.

Note that Steps S11 through S17 in the flowchart in FIG. 7 are respectively the same as Steps S1 through S7 in the flowchart in FIG. 6. Thus, description of the processing in Steps S11 through S17 is not provided in the following.

After storing the total exposure amount ET to the storage 12 in Step S17, the controller 11 judges whether or not the total exposure amount ET is 17500 Cw/Ct lux×hours or greater (Step S18).

When the total exposure amount ET is 17500×Cw/Ct lux×hours or greater, the controller 11, judging that ink degradation has exceeded the permissible range, causes the display 13 to display a message (i.e., the ink replacement warning) urging the user, the administrator, or the like to remove the old ink (YES in Step S18 and then Step S19).

Then, in this case, the controller 11 deactivates and resets the timer 15 (Step S20), and terminates the ink quality management.

Meanwhile, when judging that the total exposure amount ET is not 17500×Cw/Ct lux×hours or greater, or that is, when judging that the total exposure amount ET is smaller than 17500×Cw/Ct lux×hours in Step S18, the controller 11 returns to Step S13 and acquires the exposure light amount E once again. (No in Step S18 and then Step S13). Then, in this case, the controller 11 repeats the processing from Step S13 to Step S18 until judging in Step S18 that the total exposure amount ET is 17500 Cw/Ct lux×hours or greater.

[Summary of Embodiment 2]

As described up to this point, in the organic light-emitting device manufacturing method pertaining to the present embodiment, the ink replacement warning is displayed on the display 13 when the total exposure amount ET becomes 17500×Cw/Ct lux×hours or greater in an environment where light constituted of light components with wavelengths 500 nm or greater is radiated. Accordingly, in the organic light-emitting device manufacturing method pertaining to the present embodiment, the risk of ink whose degradation has exceeded a permissible range being used in the manufacturing of organic light-emitting devices is suppressed, and thus, the risk of defective organic light-emitting devices being manufactured is suppressed. Thus, the organic light-emitting device manufacturing method pertaining to the present embodiment has the same effects as the organic light-emitting device manufacturing method pertaining to embodiment 1.

Further, in the organic light-emitting device manufacturing method pertaining to the present embodiment, the total exposure amount ET reflects only the amount of time that an ink inside an ink transport path 450 is actually exposed to and affected by light from the lighting device 1 due to being inside a light-transmissive tube, instead of reflecting the total amount of time for which the lighting device 1 is turned on. Thus, in the organic light-emitting device manufacturing method pertaining to the present embodiment, ink quality management is performed in a more practical manner. More specifically, the organic light-emitting device manufacturing method pertaining to the present embodiment suppresses the risk of ink being removed and discarded wastefully, or that is, the risk of ink whose degradation has not actually exceeded the permissible range being removed and discarded. Accordingly, the organic light-emitting device manufacturing method pertaining to the present embodiment achieves cost reduction. Further, the organic light-emitting device manufacturing method pertaining to the present embodiment reduces the frequency of ink replacement, and thus improves work efficiency.

Note that the manufacturing method pertaining to the present embodiment, which includes the above-described ink quality management, may be applied to an organic light-emitting device manufacturing system including the organic light-emitting device manufacturing apparatus 100 and the lighting device 1.

Further, when expressing the total exposure amount ET by using a constant α to indicate the condition to be satisfied for the ink replacement warning to be displayed on the display (the condition in Step S8 of FIG. 6 or Step S18 in FIG. 7), the total exposure amount ET can be expressed as ET≥α×17500 lux×hours. Embodiment 1 corresponds to when α=1 is satisfied in this expression, and embodiment 2 corresponds to when α=Cw/Ct is satisfied in this expression. When α=Cw/Ct is satisfied, α≥1 is also satisfied due to Cw/Ct>1 being satisfied.

<<MODIFICATIONS>>

Up to this point, the present invention has been described based on embodiments 1 and 2. However, embodiments 1 and 2 are non-limiting examples of how the present invention may be implemented, and naturally, modifications such as those described in the following may be made. Note that in the following, in order to avoid the same explanation from being provided multiple times, the constituent elements already described in the embodiments are provided with the reference signs used in the embodiments and description of such constituent elements is not provided.

(Modification 1)

In the embodiments, description is provided of an example where the manufacturing apparatus 100 is used without any light-blocking object present between the lighting device 1 and the tubes 45a, 45b, 45c, and 45d. However, a light-blocking member may be arranged between the lighting device 1 and the tubes 45a, 45b, 45c, and 45d.

Typically, while the manufacturing apparatus 100 is in operation (i.e., during manufacturing of organic light-emitting devices), no worker (no user or no administrator) basically enters the site (a factory or the like) where the manufacturing apparatus 100 is installed, and the lighting device 1 is turned off. Meanwhile, the lighting device 1 may be turned on under the following situations.

The first situation is when maintenance of the manufacturing apparatus 100 is conducted. Maintenance of the manufacturing apparatus 100 includes the detection of bad inkjet head nozzles, the wiping of inkjet heads, the replacement of ink, and the checking and repairing of the manufacturing apparatus 100. During such maintenance, the ink ejector unit 30 is stopped except for when the movement of the linear motors 24a and 24b is being checked. However, during maintenance, the manufacturing apparatus 100 is not turned off in order to keep maintain ink circulation inside the ink transport paths 450 and thereby prevent the hardening of ink. Note that in the present disclosure, a state of the manufacturing apparatus 100 while the manufacturing apparatus 100 is in standby and is not executing the manufacturing of organic light-emitting devices is referred to as a maintenance mode of the manufacturing apparatus 100.

The second situation is when a worker needs to enter the site for a certain purpose even though the manufacturing apparatus 100 is in operation (i.e., manufacturing organic light-emitting devices). Examples of cases where a worker would need to enter the site while the manufacturing apparatus 100 is in operation include, for example, when a stock of equipment is being stored in an unused space inside the site and the worker needs to take in or take out the equipment, and when the worker has left one of his belongings inside the site and returns to the site to collect the belonging. Note that in the present disclosure, a state of the manufacturing apparatus 100 while the manufacturing apparatus 100 is manufacturing organic light-emitting devices is referred to as a manufacturing mode of the manufacturing apparatus 100.

The following needs to be taken into consideration in installing the light-blocking member. While the manufacturing apparatus 100 is in the maintenance mode, the ink ejector unit 30 remains still. However, while the manufacturing apparatus 100 is in the manufacturing mode, the ink ejector unit 30 moves in the X-axis direction over the stage ST. Due to this, while the manufacturing apparatus 100 is in the manufacturing mode, the tubes 45a, 45b, 45c, and 45d also move in the X-axis direction. Due to this, the light-blocking member needs to be arranged at a position where the light-blocking member does not interfere with this movement of the tubes 45a, 45b, 45c, and 45d. Further, while it is desirable to prevent the tubes 45a, 45b, 45c, and 45d from being exposed to light as much as possible, it is also necessary to keep the other parts of the manufacturing apparatus 100 exposed to light as much as possible. This is since the lighting device 1 is turned on when a user needs to carry out work with the manufacturing apparatus 100, and in order to make it easy for the user to carry out the work, it is desirable to keep the other parts of the manufacturing apparatus 100 exposed to light as much as possible. The following describes a manufacturing system pertaining to the present modification, which includes a light-blocking member and has a structure taking into consideration such aspects.

Figure 8:
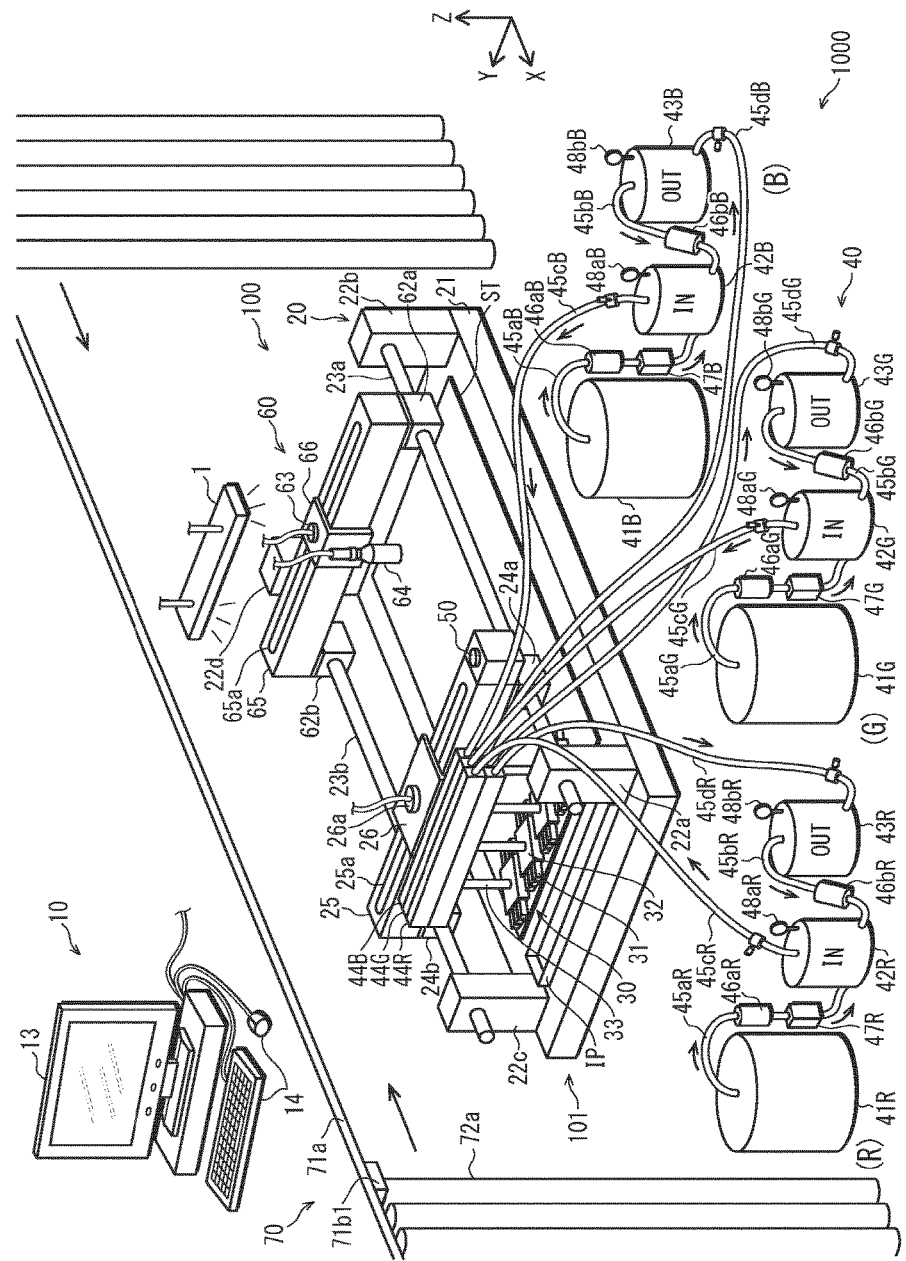
FIG. 8 is a perspective diagram schematically illustrating the external appearance and the structure of an organic light-emitting device manufacturing system pertaining to modification 1, in a state where a light-blocking member is positioned at its open position.
Figure 9:
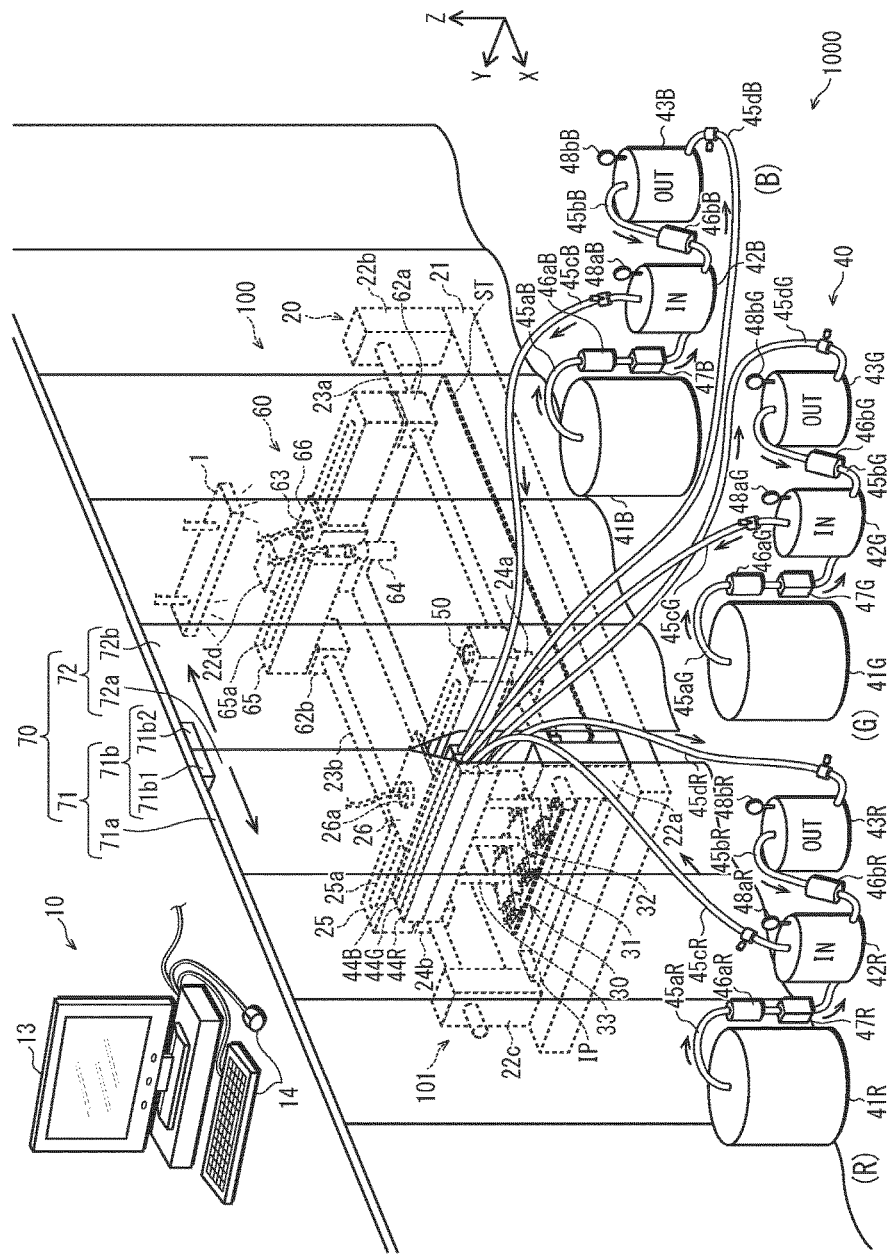
FIG. 9 is a perspective diagram schematically illustrating the external appearance and the structure of the organic light-emitting device manufacturing system pertaining to modification 1, in a state where the light-blocking member is positioned at a light-blocking position.

The following describes the structure of an organic light-emitting device manufacturing system 1000 pertaining to modification 1, with reference to FIGS. 8 and 9.

As illustrated in FIGS. 8 and 9, the organic light-emitting device manufacturing system 1000 pertaining to the present modification includes the manufacturing apparatus 100 and a light-blocking unit 70.

The light-blocking unit 70 includes a light-blocking member holder 71 and a light-blocking member 72.

The light-blocking member holder 71 includes a guide rail 71a and a movable member 71b that holds a part of the light-blocking member 72 and is movable along the guide rail 71a.

The guide rail 71a is an elongated piece of metal material. The guide rail 71a is arranged higher than the lighting device 1 and is arranged substantially parallel to the X axis between the manufacturing apparatus main body 101 and the tanks (supply tanks 41, IN tanks 42, and OUT tanks 43) of the ink supply units 40.

The movable member 71b has an undepicted built-in motor, and is connected to the controller 11 via an undepicted cable. When the motor is driven by the controller 11, the movable member 71b moves along the guide rail 71a. Note that in the present modification, the movable member 71b is composed of a pair of movable members, namely a movable member portion 71b1 and a movable member 71b2 portion, each having a built-in motor. Note that the movable member portion 71b2 is not illustrated in FIG. 8 for being located outside the range illustrated.

The light-blocking member 72 is a member that blocks light, and is a fabric-like or plate-like member. In the present embodiment, the light-blocking member 72 is a shading curtain, and is composed of a light-blocking member portion 72a held by the movable member portion 71b1 and a light-blocking member portion 72b held by the movable member portion 71b2.

When implementing the light-blocking member 72 by using a plate-like member, it is beneficial to implement the light-blocking member 72 to be similar to a vertical blind, by using two or more plate-like members that are swingable and that overlap one another due to not being precisely on the same plane as one another. This structure allows the tubes 45a, 45b, 45c, 45d to move, and at the same time, suppresses the risk of these tubes being exposed to light. When implementing the light-blocking member 72 by using a plate-like member, the material of the plate-like member may be, for example, wood, a metal, a ceramic material, or an opaque resin. Alternatively, the light-blocking member 72 may be implemented by using a plate-like member made for example of a light-transmissive resin and for example coating the surface of the plate-like member with a light-blocking coating material or adhering a fabric, paper, etc., that has a light-blocking property on the surface of the plate-like member.

FIG. 8 illustrates a state of the manufacturing system 1000 where the light-blocking member 72 is not present between the lighting device 1 and the tubes 45a, 45b, 45c, and 45d, and thus light from the lighting device 1 is not blocked by the light-blocking member 72. Note that in the following, the position of the light-blocking member 72 when the light-blocking member 72 is not blocking light from the lighting device 1 to the tubes 45a, 45b, 45c, and 45d is referred to as an open position of the light-blocking member 72.

Meanwhile, FIG. 9 illustrates a state of the manufacturing system 1000 where the light-blocking member 72 is present between the lighting device 1 and the tubes 45a, 45b, 45c, and 45d, and thus light from the lighting device 1 is being blocked by the light-blocking member 72. Note that in the following, the position of the light-blocking member 72 when the light-blocking member 72 is blocking light from the lighting device 1 to the tubes 45a, 45b, 45c, and 45d is referred to as a light-blocking position of the light-blocking member 72. In the present embodiment, when the light-blocking member 72 is at the light-blocking position, portions of the tubes 45c and 45d near ends thereof connected to the distribution tanks 44 are sandwiched between the light-blocking member portion 72a and the light-blocking member portion 72b. However, since the light-blocking member portions 72a and 72b are fabric curtains and are capable of deforming in the present embodiment, there is no risk of such portions of the tubes 45c and 45d being damaged by being sandwiched between the light-blocking member portions 72a and 72b.

The following describes the details of the ink quality management in the manufacturing method executed in the manufacturing system 1000 pertaining to the present modification.

Figure 10:
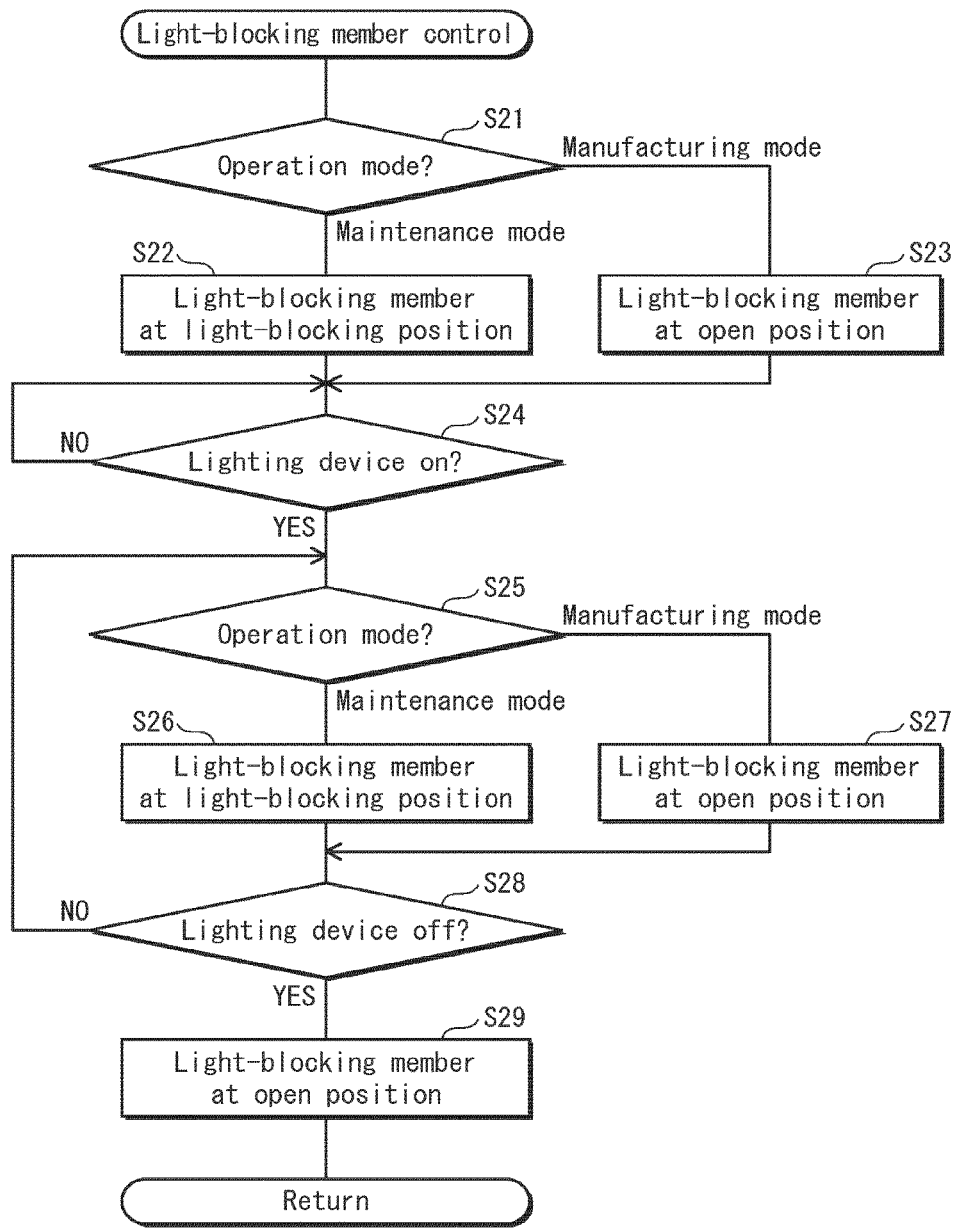
FIG. 10 is a flowchart illustrating light-blocking member control in an organic light-emitting device manufacturing method pertaining to modification 1.

FIG. 10 is a flowchart illustrating light-blocking member control performed by the controller 11 in the manufacturing method executed in the organic light-emitting device manufacturing system 1000 pertaining to the present modification.

Similar to the ink quality management sub-routines pertaining to embodiments 1 and 2, the light-blocking member control pertaining to the present modification is a sub-routine of the undepicted main routine for controlling the entire manufacturing apparatus 100 and is called and executed at a predetermined timing in the execution of the main routine.

When the manufacturing apparatus 100 is turned on and the light-blocking member control is commenced, the controller 11 first specifies the operation mode of the manufacturing apparatus 100 (Step S31). Specifically, the controller 11 determines whether the manufacturing apparatus 100 is in the maintenance mode or in the manufacturing mode. Note that while the entire manufacturing apparatus 100 is actually in the maintenance mode or the manufacturing mode, the controller 11 may make this determination by determining whether the manufacturing apparatus main body 101 is in the maintenance mode or the manufacturing mode. That is, the operation mode of the manufacturing apparatus main body 101 may be considered as the operation mode of the manufacturing apparatus 100.

While the manufacturing apparatus 100 is in the maintenance mode, the ink ejector unit 30 remains still, and thus, the tubes 45c and 45d connected to the distribution tanks 44 also remain still. Due to this, when the manufacturing apparatus 100 is in the maintenance mode, there is no risk of the tubes 45c and 45d coming in contact with the light-blocking member 72, even if the light-blocking member 72 is in the light-blocking position. Accordingly, when determining that the manufacturing apparatus 100 is in the maintenance mode in Step S21, the controller 11 puts the light-blocking member 72 in the light-blocking position ("Maintenance mode" in Step S21, and then Step S22). Specifically, the controller 11 moves the movable member portion 71b1 and the movable member portion 71b2 (i.e., the movable member 71b) so that the light-blocking member 72 is held at the light-blocking position. If the light-blocking member 72 is already at the light-blocking position, the controller 11 keeps the movable member 71b where it is.

Subsequently, the lighting device 1 determines whether the lighting device 1 is on (Step S24).

Meanwhile, the ink ejector unit 30 moves while the manufacturing apparatus 100 is in the manufacturing mode. Due to this, if the light-blocking member 72 is at the light-blocking position while the manufacturing apparatus 100 is in the manufacturing mode, the tubes 45c and 45d may come in contact with the light-blocking member 72. This may result in problems such as the tubes 45c and 45d coming off from the distribution tanks 44 and the movement of the ink ejector unit 30 being interfered with. Accordingly, when determining that the manufacturing apparatus 100 is in the manufacturing mode in Step S21, the controller 11 puts the light-blocking member 72 at the open position ("Manufacturing mode" in Step S21, and then Step S23). Specifically, the controller 11 moves the movable member portion 71b1 and the movable member portion 71b2 (i.e., the movable member 71b) so that the light-blocking member 72 is held at the open position. If the light-blocking member 72 is already at the open position, the controller 11 keeps the movable member 71b where it is.

Subsequently, the lighting device 1 determines whether the lighting device 1 is on (Step S24).

When not determining that the lighting device 1 is on in Step S24, or that is, when determining that the lighting device 1 is off in Step S21, the controller 11 repeats the determination of whether the lighting device 1 is on (No in Step S24, and then Step S24).

When determining that the lighting device 1 is on in Step S24, the controller 11 then determines the operation mode of the manufacturing apparatus 100 (YES in Step S24, and then Step S25).

When determining that the manufacturing apparatus 100 is in the maintenance mode, the controller 11 puts the light-blocking member 72 at the light-blocking position ("Maintenance mode" in Step S25, and then Step S26).

Subsequently, the controller 11 determines whether the lighting device 1 is off (Step S28).

When determining that the manufacturing apparatus 100 is in the manufacturing mode in Step S25, the controller 11 puts the light-blocking member 72 at the open position ("Manufacturing mode" in Step S25, and then Step S27). In this case, the lighting device 1 is on and the light-blocking member 72 is at the open position. Due to this, the tubes 45 (i.e., the tubes 45a, 45b, 45c, 45d) are exposed to light from the lighting device 1. Here, if the light-blocking member 72 were to be put at the light-blocking position while the manufacturing apparatus 100 is in the manufacturing mode, problems may occur such as the movement of the ink ejector unit 30 being interfered with and detachment of the tubes 45c and 45d from the distribution tanks 44. Consequently, there is a risk of problems occurring such as the manufacturing of defective organic light-emitting devices and the interruption of the organic light-emitting device manufacturing process should the light-blocking member 72 be put at the light-blocking position while the manufacturing apparatus 100 is in the manufacturing mode. Accordingly, when the manufacturing apparatus 100 is in the manufacturing mode, the light-blocking member 72 is put at the open position, prioritizing the prevention of such problems over the blocking of light. Further, even if the tubes 45 (i.e., the tubes 45a, 45b, 45c, 45d) are exposed to light from the lighting device 1 in the case described above, use of ink whose degradation has exceeded the permissible range is prevented because the exposure light amount sensor 50 is detecting exposure light amount and the ink quality management illustrated in FIG. 6 or FIG. 7 is being executed.

Then, following Step S27, the controller 11 determines whether the lighting device 1 is off (Step S28).

When not determining that the lighting device 1 is off in Step S28, or that is, when determining that the lighting device 1 is on in Step S28, the controller 11 returns to Step S25 and determines the operation mode of the manufacturing apparatus 100 (NO in Step S28, and then Step S25). Then, in this case, the controller 11 repeats the processing from Step S25 to Step S28 until determining in Step S28 that the lighting device 1 is off.

Meanwhile, when determining that the lighting device 1 is off in Step S28, the controller 11 puts the light-blocking member 72 at the open position (YES in Step S8, and then Step S29), and then returns to the main routine.

As such, in the organic light-emitting device manufacturing system pertaining to the present modification, the exposure of the tubes 45 to light from the lighting device 1 is suppressed as much as possible. Thus, ink degradation is suppressed to a further extent, and the amount of time is extended until the total exposure amount ET reaches the maximum total exposure amount permissible in terms of ink degradation. This reduces the frequency of ink replacement necessitated by ink degradation, and thereby reduces cost and improves work efficiency.

Note that the manufacturing system 1000 pertaining to modification 1 may or may not include the lighting device 1.

(Modification 2)

In modification 1, the light-blocking member 72 is put at the open position when the lighting device 1 is turned on while the manufacturing apparatus 100 is in the manufacturing mode. Thus, under such conditions, the tubes 45 are exposed to light from the lighting device 1.

Meanwhile, in modification 2, description is provided of a configuration including a lighting device that has, in addition to a light source emitting the light (referred to in the following as first light) emitted by the lighting device 1 in the embodiments and modification 1, a light source that emits light (referred to in the following as second light) constituted of light components with wavelengths longer than wavelengths of the light components of the first light. Further, in the configuration pertaining to modification 2, these two light sources can be turned on selectively. Note that in the following, the light source emitting the first light is referred to as a first light source and the light source emitting the second light is referred to as a second light source.

Further, note that the illumination device is included in the manufacturing system pertaining to the present modification, with the illumination device connected with the controller 11 (refer to FIG. 3) of the manufacturing apparatus main body 101. Further, in the present modification, the controller 11 controls the lighting device to selectively turn on the first light source and the second light source.

Further, in the present embodiment, the second light is constituted of light components with wavelengths of 650 nm or longer, and specifically, the second light is red light. However, the second light may be constituted of light components with different wavelengths. For example, the second light may be constituted of light components with wavelengths of 620 nm or longer, and for example, the second light may be infrared light.

Figure 11:
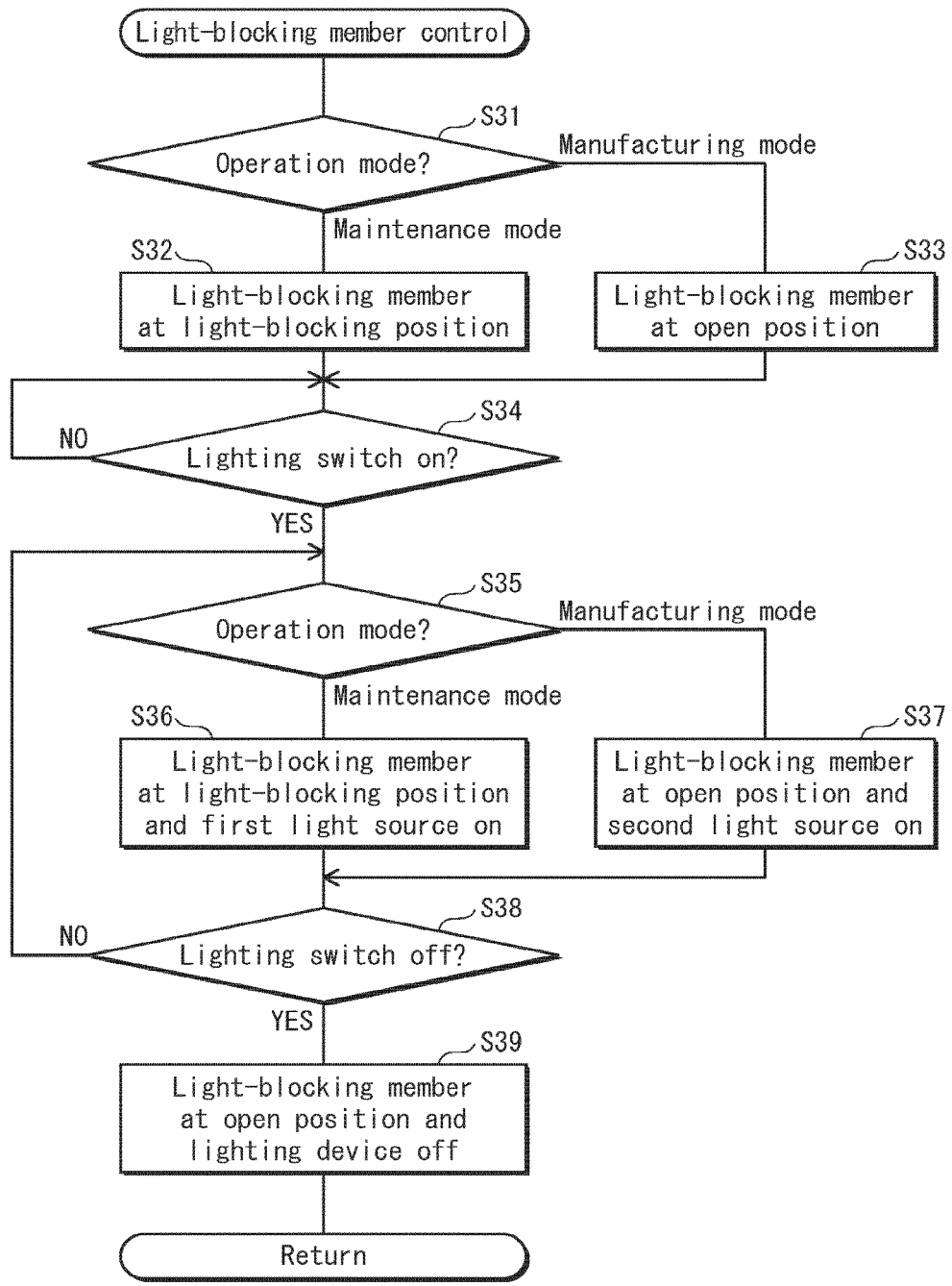
FIG. 11 is a flowchart illustrating light-blocking member control in an organic light-emitting device manufacturing method pertaining to modification 2.

FIG. 11 is a flowchart illustrating light-blocking member control performed by the controller 11 in the manufacturing method executed in the organic light-emitting device manufacturing system pertaining to modification 2. Note that the organic light-emitting device manufacturing system pertaining to modification 2 is similar to the manufacturing system 1000 pertaining to modification 1, differing from the manufacturing system 1000 only in that the manufacturing system includes the lighting device, that the lighting device is capable of selectively turning on the first light source and the second light source, and the controller 11 connected to the lighting device controls the lighting device. Further, the organic light-emitting device manufacturing system pertaining to modification 2 has a basic appearance similar to that of the manufacturing system 1000 illustrated in FIGS. 8 and 9. Accordingly, the lighting device pertaining to the present modification is provided with the same reference sign as the lighting device pertaining to modification 1. That is, the lighting device pertaining to the present modification is indicated by reference sign "1".

Similar to the ink quality management sub-routines pertaining to the embodiments and the light-blocking member control sub-routine pertaining to modification 1, the light-blocking member control pertaining to the present modification is a sub-routine of the undepicted main routine for controlling the entire manufacturing apparatus 100 and is called and executed at a predetermined timing in the execution of the main routine.

Note that Steps S31 through S33 are respectively the same as Steps S21 through S23 in the flowchart in FIG. 10, which illustrates the light-blocking member control pertaining to modification 1. Thus, description of the processing in Steps S31 through S33 is not provided in the following.

Following Steps S32 and S33, the controller 11 determines whether a lighting switch has been turned on (Step S34). The lighting switch is mounted on a wall or the like, and is used by a user for turning on and off the lighting device. Thus, the lighting switch is a so-called wall light switch. Note that the lighting switch need not be a wall light switch, and may alternatively by a remote controller or the like.

When not determining that the lighting switch has been turned on, or that is, when determining that the lighting switch is off, the controller 11 repeats the determination of whether the lighting switch has been turned on (NO in Step S34, and then Step S34).

Meanwhile, when determining that the illumination switch has been turned on, the controller 11 then determines the operation mode of the manufacturing apparatus 100 (YES in Step S34, and then Step S35).

When determining that the manufacturing apparatus 100 is in the maintenance mode, the controller 11 puts the light-blocking member 72 at the light-blocking position and causes the lighting device 1 to turn on the first light source ("Maintenance mode" in Step S35, and then Step S36).

Meanwhile, when determining that the manufacturing apparatus 100 is in the manufacturing mode, the controller 11 puts the light-blocking member 72 at the open position and causes the lighting device 1 to turn on the second light source ("Manufacturing mode" in Step S35, and then Step S37).

Following Steps S36 and S37, the controller 11 determines whether the lighting switch has been turned off (Step S38).

When not determining that the lighting switch has been turned off, or that is, when determines that the lighting device is on, the controller 11 returns to Step S35 and determines the operation mode of the manufacturing apparatus 100 (NO in Step S38, and then Step S35). Then, in this case, the controller 11 repeats the processing from Step S35 to Step S38 until determining in Step S38 that the lighting switch has been turned off. This ensures appropriate control even if the operation mode of the manufacturing apparatus 100 is changed while the lighting device is on.

Meanwhile, when determining that the lighting switch has been turned off in Step S38, the controller 11 puts the light-blocking member 72 at the open position and causes the lighting device 1 to turn off (YES in Step S38, and then Step S39). Here, when processing flows from Step S36 to Step S38, and then Step S39, the first light source is turned off in Step S39 because only the first light source has been turned on and the second light source remains off. Meanwhile, when processing flows from Step S37 to Step S38, and then Step S39, the second light source is turned off in Step S39 because only the second light source has been turned on and the first light source remains off. Finally, the controller 11 returns to the main routine.

According to the light-blocking member control pertaining to the present modification, when the lighting device has to be turned on with the light-blocking member 72 at the open position, the second light source is turned on and not the first light source. As described above, the second light source emits the second light, which is constituted of light components having wavelengths longer than the wavelengths of the light components of the first light and thus, is constituted of light components with wavelengths of a wavelength range not including at all or barely including the light absorption peak wavelengths of ink. Accordingly, even if the second light reaches the tubes 45 and reaches the ink inside, the ink is not likely to undergo degradation. Thus, ink degradation occurring when the tubes 45 are exposed to the second light is smaller than that occurring when the tubes 45 are exposed to the first light. In addition, even if a user needs to work with the manufacturing apparatus in the manufacturing mode, the user is able to carry out the work easily with the lighting device 1 on, compared to when the lighting device 1 is off and the user needs to use a flashlight or the like to carry out the work.

(Modification 3)

In modifications 1 and 2, the light-blocking member 72 is a shading curtain. However, the light-blocking member 72 need not be a shading curtain. For example, the light-blocking member 72 may be an accordion screen mounted on the floor or may be a plate-like member that has a light-blocking property and that is movable over the floor. When implementing the light-blocking member 72 by using a plate-like member, the material of the plate-like member may be, for example, wood, a metal, cement, a ceramic material, or an opaque resin. Alternatively, the light-blocking member 72 may be implemented by using a plate-like member made for example of a light transmissive resin and for example coating the surface of the plate-like member with a light-blocking coating material or adhering a fabric, paper, etc., that has a light-blocking property on the surface of the plate-like member.

(Modification 4)

In the embodiments and the modifications, description is provided that the tubes 45 (i.e., the tubes 45a, 45b, 45c, and 45d) are made of a fluorine resin. However, the tubes 45 need not be made of a fluorine resin. Any other material that has sufficient flexibility and resistance against solvents, and contains impurities at an amount small enough not to affect ink may be used for the tubes 45.

(Modification 5)

In the embodiments and the modifications, description is provided that the tubes 45 (i.e., the tubes 45a, 45b, 45c, and 45d) are all made of a light-transmissive resin. However, not all the tubes 45 need to be made of a light-transmissive resin. Specifically, among the tubes 45, the tubes 45a each connect a supply tank 41 with an IN tank 42, and the tubes 45b each connect an IN tank 42 with an OUT tank 43, and the tubes 45a and 45b are not connected to any of the distribution tanks 44. Since the tubes 45a and 45b are each connected to stationary tanks, the tubes 45a and 45b do not move, and thus do not need to have flexibility as high as that of the tubes 45c and 45d.

Accordingly, the tubes 45a and 45b may be implemented by using tubes made of light-blocking materials. Examples of such materials include resin and rubber materials such as vinyl chloride resin, polystyrene, butyl rubber, and urethane. Alternatively, the tubes 45a and 45b may be implemented by using a metal material such as stainless steel.

Alternatively, the tubes 45a and 45b may be implemented by using a tube made of a fluorine resin and coating the tube for example with a resin such as polyvinyl chloride or a metal thin film.

Alternatively, the tubes 45a and 45b may be implemented by using a tube composed of two or more layers. When making this modification, the innermost layer may be a tube made of a fluorine resin, and each outer layer may be made of a material, such as a resin or rubber, having a light-blocking property. When using a light-blocking resin for an outer layer, the resin may be a fluorine resin having dispersed therein black pigment, a filler, or the like.

(Modification 6)

In modifications 1 and 2, the light-blocking member 72 is movable. However, the light-blocking member 72 need not be movable. That is, the light-blocking member 72 may be stationary.

Figure 12:
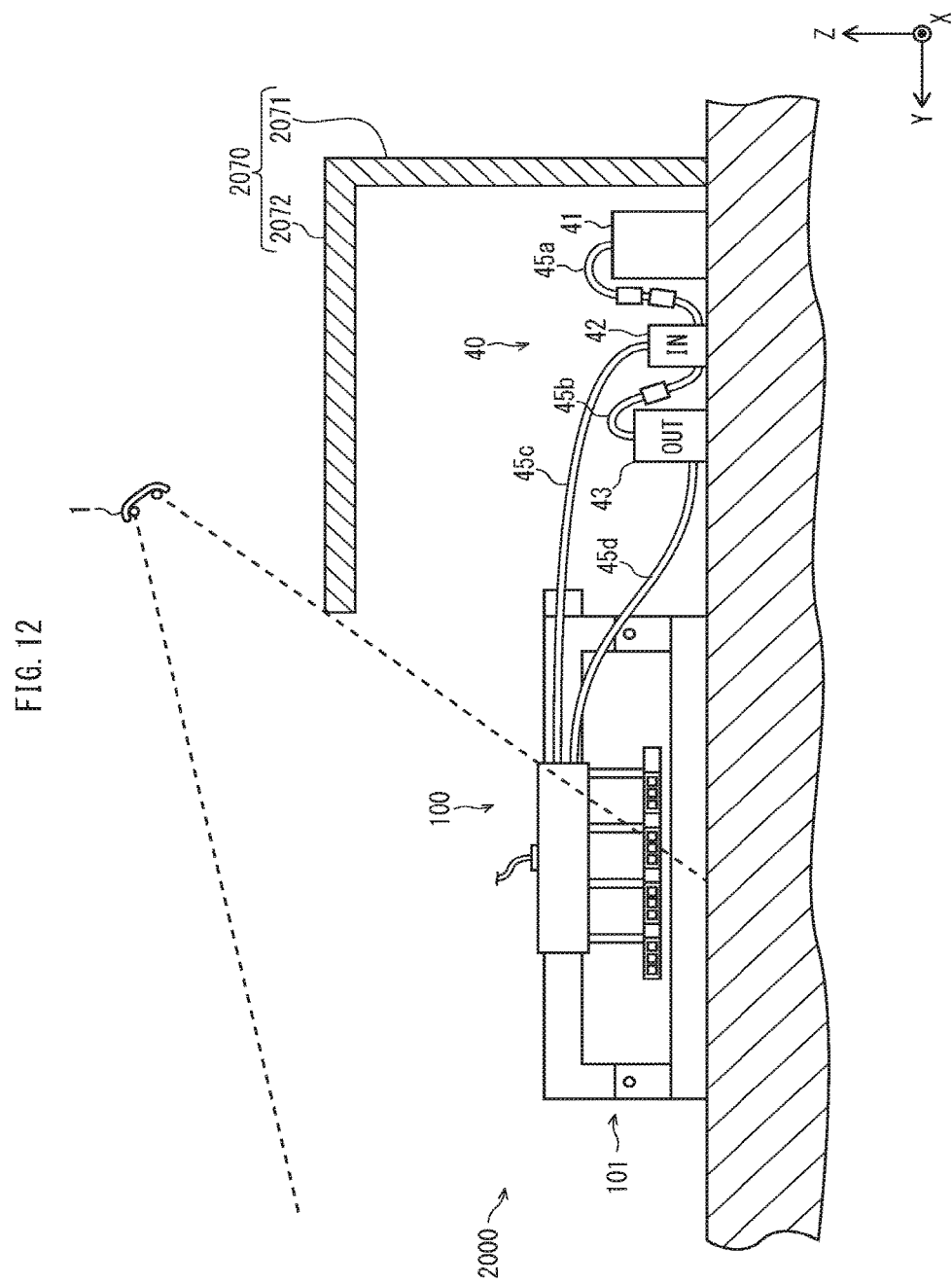
FIG. 12 is a lateral view diagram schematically illustrating the overall structure of an organic light-emitting device manufacturing system pertaining to modification 6.

FIG. 12 is a lateral view diagram illustrating the overall structure of a manufacturing system 2000 pertaining to modification 6. Main components of the manufacturing system 2000 include the manufacturing apparatus 100, the lighting device 1, and a light-blocking unit 2070.

As illustrated in FIG. 12, the light-blocking unit 2070 includes a light-blocking member holder 2071 that stands on the floor, and a light-blocking member 2072 that is fixed to an upper end of the light-blocking member holder 2071. The light-blocking unit 2070 has an inverse L-shape, and the light-blocking member 2072 covers the ink supply units 40 from above and can be said to be a roof. The material of the light-blocking member 2072 may be, for example, wood, a metal, cement, a ceramic material, or an opaque resin, and any light-blocking material may be used for the light-blocking member 2072.

Further, in the present modification, the lighting device 1 is located above the light-blocking member 2072. Specifically, the lighting device 1 is disposed opposite the manufacturing apparatus main body 101 with respect to an end portion of the light-blocking member 2072 that is not connected to the light-blocking member holder 2071. As such, light from the lighting device 1 does not reach the ink supply units 40 directly due to the shading provided by the light-blocking member 2072, but directly reaches at least a half of the manufacturing apparatus main body 101 that is located distant from the ink supply units 40.

The structure described above suppresses ink degradation by reducing the light to which the tubes 45 are exposed, and in addition, ensures that the manufacturing apparatus main body 101 is under bright light to facilitate work with the manufacturing apparatus main body 101.

Note that cross-sectional illustration of the light-blocking unit 2070 and the floor is provided in FIG. 12. Further, FIG. 12 does not illustrate the control unit 10 of the manufacturing apparatus 100.

Further, the light-blocking member 2072 need not be fixed to the upper end of the light-blocking member holder 2071. That is, the light-blocking member 2072 may be fixed to any position of the light-blocking member holder 2071 as long as the light-blocking member 2072 covers the ink supply units 40 from above. Alternatively, the light-blocking member 2072 may be fixed to a wall of the room in which the manufacturing apparatus 100 is installed, in which case the wall to which the light-blocking member 2072 is fixed serves as the light-blocking member holder 2071. Alternatively, the light-blocking member 2072 may for example by hung from the ceiling of the room. Further, the light-blocking member 2072 need not be disposed to be substantially parallel with the floor surface, and may be fixed to the light-blocking member holder 2071 to be inclined relative to the floor surface.

(Modification 7)

The observation of ink droplets ejected from the inkjet heads 31 with the observation unit 60, which is performed in the detection of bad nozzles, may be performed by using infrared lighting and an infrared camera, because there is no need to distinguish the colors R, G, and B. Further, even when using a conventional CCD camera to perform the observation, a lamp emitting red light may be used for lighting. Using light constituted of light components with wavelengths longer than wavelengths of light components constituting yellow light enables suppressing ink degradation to a further extent.

(Modification 8)

The embodiments and the modifications describe a configuration where ink contained in an ink transport path 450 is replaced when the total exposure amount ET becomes equal to or greater than a predetermined threshold. However, ink replacement need not be performed in such a manner. For example, not only the ink contained in the ink transport path 450 but also ink contained in tubes 45*a* may be removed and replaced with new ink. Alternatively, not only the ink contained in the ink transport path 450 and the ink contained in the tubes 45*a*, but also the ink contained in a supply tank 41 may also be replaced with new ink.

(Modification 9)

In modification 2, description is provided of a control method of selecting light to be emitted from among two types of light constituted of light components having different wavelengths. However, the control of light need not be performed in the manner described in modification 2. For example, the lighting device may be configured such that the brightness of the light emitted by the lighting device can be changed in discrete steps, and the control unit may change the brightness of light from the lighting device. The following describes an example where the structure of the present modification is applied to the structure described in embodiment 1.

Figure 13:
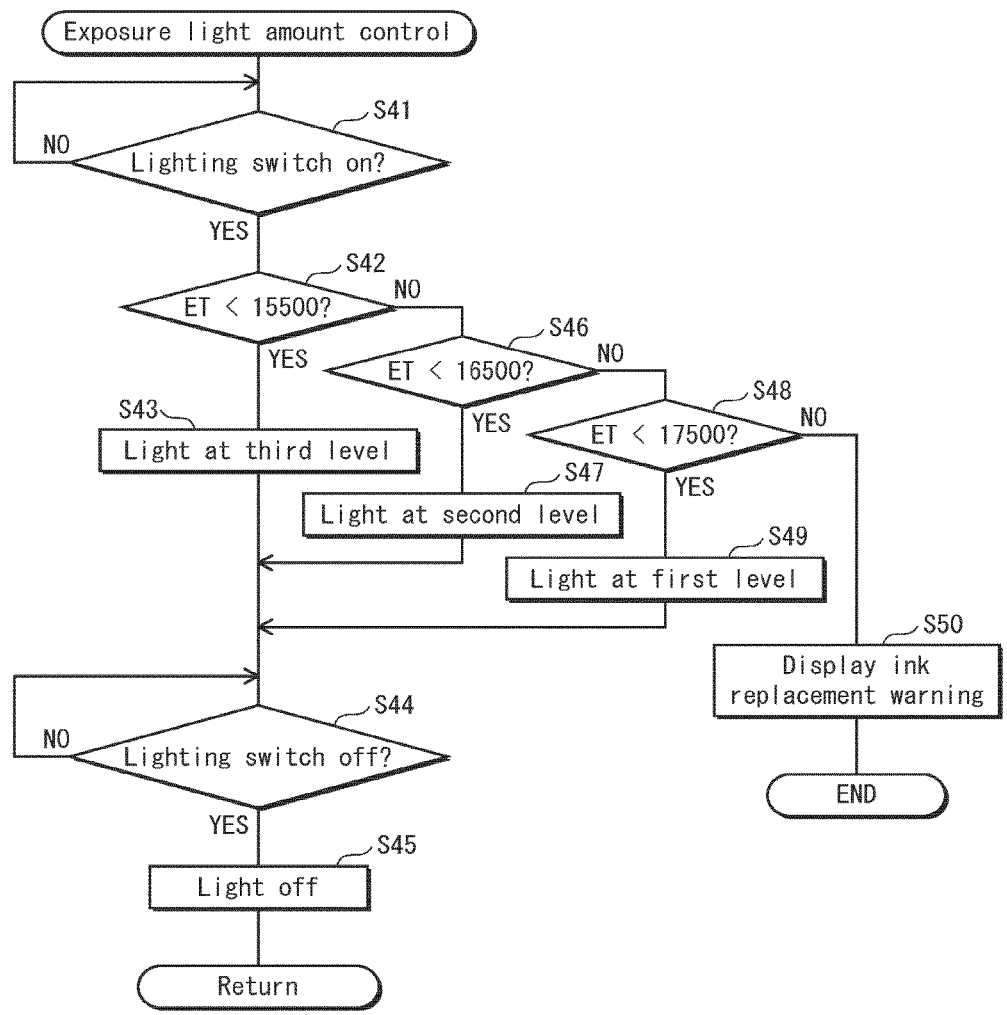
FIG. 13 is a flowchart illustrating exposure light amount control in an organic light-emitting device manufacturing method pertaining to modification 9.

FIG. 13 is a flowchart illustrating exposure light amount control performed by the controller 11 in the manufacturing method executed in the organic light-emitting device manufacturing system pertaining to modification 9. Note that the organic light-emitting device manufacturing system pertaining to modification 9 has the same basic structure as the manufacturing system 1000 pertaining to modification 1, which is illustrated in FIGS. 8 and 9, and differs from the manufacturing system 1000 pertaining to modification 1 only in that the brightness of the lighting device connected to the controller 11 can be changed in discrete steps. The lighting device pertaining to the present modification is provided with the same reference sign as the lighting device pertaining to modification 1. That is, the lighting device pertaining to the present modification is indicated by reference sign "1".

Further, the lighting device pertaining to the present modification is capable of emitting light at three brightness levels, namely a first brightness level, a second brightness level, and a third brightness level. Further, the third brightness level is brighter than the second brightness level, and the second brightness level is brighter than the first brightness level.

Similar to the ink quality management sub-routines pertaining to the embodiments and the light-blocking member control sub-routine pertaining to modification 1, the exposure light amount control pertaining to the present modification is a sub-routine of the undepicted main routine for controlling the entire manufacturing apparatus 100 and is called and executed at a predetermined timing in the execution of the main routine.

First, the controller 11 determines whether a lighting switch has been turned on (Step S41). The lighting switch is mounted on a wall or the like, and is used by a user for turning on and off the lighting device. Thus, the lighting switch is a so-called wall light switch. Note that the lighting switch need not be a wall light switch, and may alternatively by a remote controller or the like.

When not determining that the lighting switch has been turned on, or that is, when determines that the lighting switch is off, the controller 11 repeats the determination of whether the lighting switch has been turned on (NO in Step S41, and then Step S41).

When determining that the lighting switch has been turned on, the controller 11 determines whether or not the total exposure amount ET is smaller than 15500 lux×hours (YES in Step S41, and then Step S42).

When determining that the total exposure amount ET is smaller than 15500 lux×hours, the control unit 11 causes the lighting device 1 to emit light at the third brightness level, which is the brightest among the three brightness levels (YES in Step S42, and then Step S43). In this case, there is no particular need to reduce the brightness of the lighting device because there still is some difference between the total exposure amount ET and 17500 lux×hours, which is the maximum total exposure amount permissible in terms of ink degradation.

Then, the controller 11 determines whether the lighting switch has been turned off (Step S44).

When determining that the lighting switch has not been turned off, the control unit 11 repeats the determination of whether or not the lighting switch has been turned off (NO in Step S44, and then Step S44).

When determining that the lighting switch has been turned off, the control unit 11 turns off the lighting device 1 (YES in Step S44, and then Step S45), and returns to the main routine.

When not determining that the total exposure amount ET is smaller than 15500 lux×hours in Step S42, or that is, when determining that the total exposure amount ET is 15500 lux×hours or greater in Step S42, the control unit 11 determines whether or not the total exposure amount ET is smaller than 16500 lux×hours (NO in Step S42, and then Step S46).

When determining that the total exposure amount ET is smaller than 16500 lux×hours, the control unit 11 causes the lighting device 1 to emit light at the second brightness level, which is the second brightest among the three brightness levels (YES in Step S46, and then Step S47). In this case, the control unit 11 reduces the brightness of the lighting device and thereby suppresses ink degradation because while there still is a small difference between the total exposure amount ET and 17500 lux×hours, which is the maximum total exposure amount permissible in terms of ink degradation, the total exposure amount ET is approaching the maximum total exposure amount, having exceeded 15500 lux×hours.

After causing the lighting device 1 to emit light at the second brightness level in Step S44, the control unit 11 goes on to Step S44. Steps S44 and S45 have already been described and thus are not described once again here.

Meanwhile, when not determining that the total exposure amount ET is smaller than 16500 lux×hours in Step S46, or that is, when determining that the total exposure amount ET is 16500 lux×hours or greater in Step S46, the control unit 11 determines whether or not the total exposure amount ET is smaller than 17500 lux×hours (NO in Step S46, and then Step S48).

When determining that the total exposure amount ET is smaller than 17500 lux×hours in Step S48, the control unit 11 causes the lighting device 1 to emit light at the first brightness level, which is the darkest among the three brightness levels (YES in Step S48, and then Step S49). In this case, the control unit 11 further reduces the brightness of the lighting device and thereby further suppresses ink degradation because the total exposure amount ET is closing in to 17500 lux×hours, which is the maximum total exposure amount permissible in terms of ink degradation.

After causing the lighting device 1 to emit light at the first brightness level in Step S49, the control unit 11 goes on to Step S44. Steps S44 and S45 have already been described and thus are not described once again here.

Meanwhile, when not determining that the total exposure amount ET is smaller than 17500 lux×hours, or that is, when determining that the total exposure amount ET is equal to or greater than 17500 lux×hours, the control unit 11 causes the display 13 to display the ink replacement warning, or that is, a message urging the user to remove old ink (NO in Step S48, and then Step S50). Then, the controller 11 terminates the exposure light amount control.

Should the brightness of the lighting device 1 be always decreased regardless of the total exposure amount ET, the user would have to carry out work in a dark environment, and thus user convenience is low. Meanwhile, according to the control method pertaining to the present modification, the brightness of the lighting device and thus the amount of light from the lighting device 1 to which the light transmissive tubes 45 is exposed is reduced in discrete steps as the total exposure amount ET approaches 17500 lux×hours, which is the maximum total exposure amount permissible in terms of ink degradation. Accordingly, when there is still some difference between the current total exposure amount ET and the maximum total exposure amount, the lighting device is caused to emit light at the highest brightness, prioritizing user convenience. Meanwhile, as the total exposure amount ET approaches the maximum total exposure amount, the brightness of the lighting device is gradually decreased to slower the rate of ink degradation. In other words, the control method pertaining to the present modification extends the amount of time until the total exposure amount ET reaches the maximum total exposure amount permissible in terms of ink degradation, and thereby reduces ink replacement frequency. In addition, the control method pertaining to the present modification achieves using ink as effectively as possible by increasing the possibility of the current lot of ink being used up completely before the total exposure amount ET reaches the maximum total exposure amount.

Note that in FIG. 13, the determination in Step S42 may be expressed as a determination of whether or not the total exposure amount ET is smaller than $\alpha \times 15500$, the determination in Step S46 may be expressed as a determination of whether or not the total exposure amount ET is smaller than $\alpha \times 16500$, and the determination in Step S48 may be expressed as a determination of whether or not the total exposure amount ET is smaller than $\alpha \times 17500$. In this case, setting $\alpha$ to one would achieve the combination of the present modification and embodiment 1, and setting $\alpha$ to Cw/Ct would achieve the combination of the present modification and embodiment 2. Further, $\alpha \geq 1$ is satisfied true due to Cw/Ct>1 being satisfied.

Further, the threshold used for determination in Step S42 and the threshold used for determination in Step S46 need not be 15500 lux×hours and 16500 lux×hours, respectively, and other values are usable as thresholds. That is, when denoting the threshold to be applied to the total exposure amount ET in the determination of lighting device brightness as D, any value smaller than 17500 may be set to D. Based on this, when configuring the lighting device to be selectively lightable at multiple discrete steps of brightness, at least including a first brightness and a second brightness brighter than the first brightness, the control pertaining to the present modification can be defined as follows. Specifically, the control pertaining to the present modification is a control of lighting the lighting device at the second brightness when ET<D lux×hours is satisfied, and lighting the lighting device at the first brightness when $D \leq ET < \alpha \times 17500$ lux×hours is satisfied. Here, setting a to one would achieve the combination of the present modification and embodiment 1, and setting $\alpha$ to Cw/Ct would achieve the combination of the present modification and embodiment 2.

Further, the brightness of the lighting device need not be switchable in three discrete levels. That is, the brightness of the illumination device may be switchable in two discrete levels, or may be switchable in four or more discrete levels. Accordingly, the number of different thresholds to be applied to the total exposure amount ET in the determination of lighting device brightness need not be three, and may be two or four or more.

Further, when the lighting device is configured to emit the first light and the second light as described in modification 2, the exposure light amount control pertaining to the present modification can be achieved by configuring the lighting device so that each of the first light and the second light is selectively controllable in discrete levels of brightness.

(Modification 10)

The organic light-emitting device manufacturing system pertaining to modification 9 need not include the light-blocking unit 70.

(Modification 11)

As described above, old ink (ink whose degradation is determined to have exceeded the permissible range) is removed from an ink transport path 450. After removal, such old ink for example may be simply discarded, may be subjected to some regeneration process enabling the ink to be used once again in the manufacture of organic light-emitting devices, or may be recycled and used as a material for a product other than organic light-emitting devices.

(Modification 12)

In the embodiments and the modifications, a determination is made that the maximum total exposure amount permissible in terms of ink degradation is reached when the total exposure amount ET satisfies ET=α×17500 lux×hours (where α≥1). However, the permissible maximum total exposure amount may be set to other values. For example, when the risk of defective organic light-emitting devices being manufactured is to be suppressed to a further extent, the maximum total exposure amount may be set to a value lower than α×17500 lux×hours (e.g., α×15000 lux×hours). Alternatively, when cost reduction is of high priority or depending upon the desired level of product quality, the maximum total exposure amount may be set to a value higher than α×17500 lux×hours (e.g., α×20000 lux×hours).

Up to this point, the organic light-emitting device manufacturing method, the organic light-emitting device manufacturing system, and the organic light-emitting device manufacturing apparatus pertaining to the present invention have been described based on specific examples of embodiments and modifications thereof. However, the scope of the present invention is not limited to the embodiments and the modifications. Instead, the present invention shall be construed as including forms of implementation that can be achieved by skilled artisans making various modifications that can be conceived based on the embodiments and the modifications described above, and as including various forms of implementation that can be achieved by combining the constituent elements and functions described in the embodiments and modifications described above without departing from the spirit and scope of the present invention.

INDUSTRIAL APPLICABILITY

The organic EL device manufacturing method pertaining to the present invention is suitably applicable to manufacturing methods of organic EL elements and organic EL display devices that are to be used, for example, in various display devices, various television devices, and portable electronic device displays, for household use, for use in public facilities, and/or for business use.

REFERENCE SIGNS LIST

1 lighting device
11 controller
13 display
40 ink supply units
45a, 45b, 45c, 45d tubes (light-transmissive tubes)
50 exposure light amount sensor
71 light-blocking member holder
72, 2072 light-blocking member
100 manufacturing apparatus
101 manufacturing apparatus main body
450 ink transport path
1000, 2000 manufacturing system

The invention claimed is:

1. An organic light-emitting device manufacturing method performed by a manufacturing apparatus placed in an environment where light from outside is blocked and a lighting device emitting light constituted of light components with wavelengths of 500 nm or longer is placed, the manufacturing method comprising:
   removing ink containing an organic light-emitting material inside an ink transport path that connects a tank containing the ink and an ink ejector of a main body of the manufacturing apparatus when a total exposure amount ET (lux×hours) satisfies ET≥α×17500, where α is a constant satisfying α≥1, the total exposure amount ET being defined as a product of E denoting an amount of light (lux) from the lighting device to which a light-transmissive tube that forms at least a part of the ink transport path is exposed and T denoting an amount of time (hours) over which the light-transmissive tube is exposed to the light from the lighting device.

2. The organic light-emitting device manufacturing method of claim 1, wherein
   α satisfies α=1.

3. The organic light-emitting device manufacturing method of claim 1, wherein
   α satisfies α=Cw/Ct, where
   Cw denotes a total volume of the ink transport path, and Ct denotes a volume of the light-transmissive tube.

4. The organic light-emitting device manufacturing method of claim 1, wherein
   the main body of the manufacturing apparatus is switchable between a manufacturing mode and a maintenance mode, the main body manufacturing organic light-emitting devices in the manufacturing mode and being under maintenance in the maintenance mode.

5. The organic light-emitting device manufacturing method of claim 4, wherein
   a light-blocking member is placed between the lighting device and the light-transmissive tube while the main body of the manufacturing apparatus is in the maintenance mode.

6. The organic light-emitting device manufacturing method of claim 5, wherein
   the light-blocking member is not placed between the lighting device and the light-transmissive tube while the main body of the manufacturing apparatus is in the manufacturing mode.

7. The organic light-emitting device manufacturing method of claim 4, wherein
   the lighting device is capable of selectively emitting first light and second light, the first light constituted of light components with wavelengths of 500 nm or longer, the second light constituted of light components with wavelengths of 650 nm or longer, and
   the lighting device emits the second light while the main body of the manufacturing apparatus is in the manufacturing mode, and emits the first light while the main body of the manufacturing apparatus is in the maintenance mode.

8. The organic light-emitting device manufacturing method of claim 1, wherein
   the lighting device is capable of emitting light selectively switching between multiple brightness levels at least including a first brightness level and a second brightness level brighter than the first brightness level, and the lighting device emits light with the second brightness level when the total exposure amount ET satisfies ET<D, where D denotes a predetermined value smaller than α×17500, and emits light with the first brightness level when the total exposure amount ET satisfies D≤ET<α×17500.

9. An organic light-emitting device manufacturing system placed in an environment where light from outside is blocked, the organic light-emitting device manufacturing system comprising:
a lighting device emitting light constituted of light components with wavelengths of 500 nm or longer;
a manufacturing apparatus main body having an ink ejector configured to eject an ink containing an organic light-emitting material;
an ink supplier comprising a light-transmissive tube forming at least a part of an ink transport path connecting a tank containing the ink and the ink ejector; and
an exposure light amount sensor configured to detect an amount of light from the lighting device to which the light-transmissive tube is exposed;
a display configured to display information for a user; and
a controller configured to cause the display to display information urging removal of the ink inside the ink transport path when a total exposure amount ET (lux× hours) satisfies ET≥α×17500 where α is a constant satisfying α≥1, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

10. The organic light-emitting device manufacturing system of claim 9, wherein
α satisfies α=1.

11. The organic light-emitting device manufacturing system of claim 9, wherein
α satisfies α=Cw/Ct, where
Cw denotes a total volume of the ink transport path, and Ct denotes a volume of the light-transmissive tube.

12. The organic light-emitting device manufacturing system of claim 9, wherein
the manufacturing apparatus main body is switchable between a manufacturing mode and a maintenance mode, the manufacturing apparatus main body manufacturing organic light-emitting devices in the manufacturing mode and being under maintenance in the maintenance mode.

13. The organic light-emitting device manufacturing system of claim 12 further comprising
a light-blocking member placed between the lighting device and the light-transmissive tube while the manufacturing apparatus main body is in the maintenance mode.

14. The organic light-emitting device manufacturing system of claim 13 further comprising
a light-blocking member holder holding the light-blocking member to be movable between a light-blocking position and an open position, the light-blocking member located between the light-transmissive tube and the lighting device at the light-blocking position and not located between the light-transmissive tube and the lighting device at the open position, wherein
the controller causes the light-blocking member holder to hold the light-blocking member at the light-blocking position while the manufacturing apparatus main body is in the maintenance mode, and causes the light-blocking member holder to hold the light-blocking member at the open position while the manufacturing apparatus main body is in the manufacturing mode.

15. The organic light-emitting device manufacturing system of claim 12, wherein
the lighting device comprises a first light source emitting first light and a second light source emitting second light, is capable of selectively lighting the first light source and the second light source, the first light constituted of light components with wavelengths of 500 nm or longer, the second light constituted of light components with wavelengths of 650 nm or longer, and
the controller causes the lighting device to light the second light source while the manufacturing apparatus main body is in the manufacturing mode, and causes the lighting device to light the first light source while the manufacturing apparatus main body is in the maintenance mode.

16. The organic light-emitting device manufacturing system of claim 9, wherein the lighting device is capable of emitting light selectively switching between multiple brightness levels at least including a first brightness level and a second brightness level brighter than the first brightness level, and the controller causes the lighting device to emit light with the second brightness level when the total exposure amount ET satisfies ET<D, where D denotes a predetermined value smaller than α33 17500, and causes the lighting device to emit light with the first brightness level when the total exposure amount E×T satisfies D≤ET<α× 17500.

17. An organic light-emitting device manufacturing apparatus placed in an environment where light from outside is blocked and a lighting device emitting light constituted of light components with wavelengths of 500 nm or longer is placed, the organic light-emitting device manufacturing apparatus comprising:
a main body having an ink ejector configured to eject an ink containing an organic light-emitting material;
an ink supplier comprising a light-transmissive tube forming at least a part of an ink transport path connecting a tank containing the ink and the ink ejector;
an exposure light amount sensor configured to detect an amount of light from the lighting device to which the light-transmissive tube is exposed;
a display configured to display information for a user; and
a controller configured to cause the display to display information urging removal of the ink inside the ink transport path when a total exposure amount ET (lux× hours) satisfies ET≥α×17500 where α is a constant satisfying α≥1, the total exposure amount ET being defined as a product of E denoting an amount of light (lux) from the lighting device to which the light-transmissive tube is exposed and T denoting an amount of time (hours) over which the light-transmissive tube is exposed to the light from the lighting device.

18. The organic light-emitting device manufacturing apparatus of claim 17, wherein
α satisfies aα=1.

19. The organic light-emitting device manufacturing apparatus of claim 17, wherein
α satisfies α=Cw/Ct, where
Cw denotes a total volume of the ink transport path, and Ct denotes a volume of the light-transmissive tube.

20. The organic light-emitting device manufacturing apparatus of claim 17, wherein
the organic light-emitting device manufacturing apparatus is switchable between a manufacturing mode and a maintenance mode, the organic light-emitting device manufacturing apparatus manufacturing organic light-emitting devices in the manufacturing mode and being under maintenance in the maintenance mode, and the organic light-emitting device manufacturing apparatus further comprises a light-blocking member placed between the lighting device and the light-transmissive tube while the organic light-emitting device manufacturing apparatus is in the maintenance mode.

21. An organic light-emitting device manufacturing apparatus comprising:

a light-blocking tube inside which an ink containing an organic light-emitting material flows;

a main body having an ink ejector configured to eject the ink containing the organic light-emitting material;

an ink supplier comprising a light-transmissive tube forming at least a part of an ink transport path connecting a tank containing the ink and the ink ejector; and an exposure light amount sensor configured to detect an amount of light from the lighting device to which the light-transmissive tube is exposed;

a display configured to display information for a user; and a controller configured to cause the display to display information urging removal of the ink inside the ink transport path when a total exposure amount ET (lux× hours) satisfies $ET \geq \alpha \times 17500$ where $\alpha$ is a constant satisfying $\alpha \geq 1$, the total exposure amount ET being defined as a product of E denoting an amount of light (lux) from the lighting device to which the light-transmissive tube is exposed and T denoting an amount of time (hours) over which the light-transmissive tube is exposed to the light from the lighting device, wherein the organic light-emitting device manufacturing apparatus manufactures an organic light-emitting device comprising a light-emitting layer containing the ink.

22. The organic light-emitting device manufacturing apparatus of claim 21, wherein the light-blocking tube comprises a first layer made of light-transmissive material and a second layer made of light-blocking material and covering the first layer from outside.

23. The organic light-emitting device manufacturing apparatus of claim 22, wherein the first layer is made of fluorine resin.

* * * * *